(12) United States Patent
Koyama et al.

(10) Patent No.: US 8,885,391 B2
(45) Date of Patent: Nov. 11, 2014

(54) SEMICONDUCTOR DEVICE AND SEMICONDUCTOR MEMORY DEVICE INCLUDING TRANSISTOR AND CAPACITOR

(75) Inventors: Jun Koyama, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 132 days.

(21) Appl. No.: 13/344,935

(22) Filed: Jan. 6, 2012

(65) Prior Publication Data

US 2012/0182791 A1     Jul. 19, 2012

(30) Foreign Application Priority Data

Jan. 13, 2011   (JP) ................................. 2011-004818

(51) Int. Cl.
| | | |
|---|---|---|
| *G11C 11/24* | (2006.01) | |
| *G11C 11/404* | (2006.01) | |
| *H01L 27/12* | (2006.01) | |
| *H01L 21/84* | (2006.01) | |
| *H01L 27/108* | (2006.01) | |

(52) U.S. Cl.
CPC ....... *G11C 11/4045* (2013.01); *H01L 27/10873* (2013.01); *H01L 27/1203* (2013.01); *H01L 27/108* (2013.01); *H01L 21/84* (2013.01)
USPC ...................... 365/149; 365/230.03

(58) Field of Classification Search
USPC .............................. 365/149, 230.3
See application file for complete search history.

(56) References Cited

U.S. PATENT DOCUMENTS

| | | | |
|---|---|---|---|
| 3,365,631 A | | 1/1968 | Delaney et al. |
| 4,466,081 A | | 8/1984 | Masuoka |
| 5,418,750 A | * | 5/1995 | Shiratake et al. ............. 365/206 |
| 5,446,688 A | | 8/1995 | Torimaru |
| 5,661,678 A | * | 8/1997 | Yoshida et al. ............... 365/149 |

(Continued)

FOREIGN PATENT DOCUMENTS

| | | |
|---|---|---|
| JP | 57-105889 A | 7/1982 |
| JP | 06-196647 A | 7/1994 |

OTHER PUBLICATIONS

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

(Continued)

*Primary Examiner* — Hoai V Ho
(74) *Attorney, Agent, or Firm* — Fish & Richardson P.C.

(57) ABSTRACT

A memory circuit is included. The memory circuit includes n field-effect transistors (n is a natural number of 2 or more) and n capacitors each including a pair of electrodes. A digital data signal is input to one of a source and a drain of the first field-effect transistor. One of a source and a drain of the k-th field-effect transistor (k is a natural number of greater than or equal to 2 and less than or equal to n) is electrically connected to the other of a source and a drain of the (k−1)-th field-effect transistor. One of the pair of electrodes of the m-th capacitor (m is a natural number of n or less) is electrically connected to the other of a source and a drain of the m-th field-effect transistor of the n field-effect transistors. At least two of the n capacitors have different capacitance values.

17 Claims, 12 Drawing Sheets

(56) References Cited

U.S. PATENT DOCUMENTS

| | | | |
|---|---|---|---|
| 5,731,609 A * | 3/1998 | Hamamoto et al. | 257/302 |
| 5,892,724 A * | 4/1999 | Hasegawa et al. | 365/230.03 |
| 6,151,244 A * | 11/2000 | Fujino et al. | 365/149 |
| 6,198,652 B1 * | 3/2001 | Kawakubo et al. | 365/145 |
| 2002/0041512 A1 * | 4/2002 | Kato et al. | 365/145 |
| 2003/0223263 A1 * | 12/2003 | Jacob et al. | 365/145 |
| 2011/0147737 A1 | 6/2011 | Yamazaki et al. | |
| 2011/0156117 A1 | 6/2011 | Yamazaki et al. | |

OTHER PUBLICATIONS

Yang-Shun Fan et al.; "Indium—Gallium—Zinc—Oxide Based Resistive Switching Memory for System-on-Glass Application"; Proceedings of IDW '11, The 18th International Display Workshops; Dec. 7-9, 2011; pp. 575-577.

* cited by examiner

Writing

Reading 902a  901a

902b

901b

SEMICONDUCTOR DEVICE AND SEMICONDUCTOR MEMORY DEVICE INCLUDING TRANSISTOR AND CAPACITOR

BACKGROUND OF THE INVENTION

1. Field of the Invention

One embodiment of the present invention relates to a semiconductor device. Further, one embodiment of the present invention relates to a semiconductor memory device.

2. Description of the Related Art

In recent years, a semiconductor device including a memory circuit capable of writing, reading, and erasing data has been developed.

As the semiconductor device, for example, there is a semiconductor device including a memory circuit provided with either a transistor that is a memory element (also referred to as a memory transistor) or an element formed using a ferroelectric material (for example, see Patent Document 1 and Patent Document 2).

REFERENCE

Patent Document

[Patent Document 1] Japanese Published Patent Application No. S57-105889
[Patent Document 2] Japanese Published Patent Application No. H06-196647

SUMMARY OF THE INVENTION

A conventional semiconductor device as disclosed in Patent Document 1 or Patent document 2 has a problem in that data is lost by leakage of electric charge after the data is written to a memory transistor. In a semiconductor device capable of storing data, a data retention period is preferably longer.

Further, in a conventional semiconductor device, in the case of storing a plurality of (two or more) bits of data (also referred to as multilevel data) in one memory circuit, since an analog data signal is output through a bit line, noise considerably influences the analog data signal and there is a possibility that a value of the data becomes incorrect. The larger the number of bits of data to be written is, the more severely noise influences an analog signal.

Further, in the case where a plurality of (two or more) bits of data (also referred to as multilevel data) is stored in one memory circuit in a conventional semiconductor device, the data needs to be written in the memory circuit by converting a binary digital data signal input externally into an analog data signal by a DA converter or the like and by outputting the analog data signal to a bit line. In this case, a signal conversion circuit such as a DA converter is needed.

An object of one embodiment of the present invention is at least one of the following: a longer data retention period of a memory circuit, a reduction in influence of noise on data to be written to a memory circuit, and storage of two or more bits of data in a memory circuit without the use of a signal conversion circuit such as a DA converter.

In one embodiment of the present invention, a memory circuit including a plurality of selection transistors and a plurality of capacitors is provided. With this structure, states of the plurality of selection transistors are controlled and two or more bits of digital data is stored with the use of different capacitors depending on the order of the bit, so that a plurality of bits of data is stored without the use of a signal conversion circuit such as a DA converter.

One embodiment of the present invention is a semiconductor device provided with a memory circuit that includes n field-effect transistors (n is a natural number of 2 or more) and n capacitors each including a pair of electrodes. A digital data signal is input to one of a source and a drain of the first field-effect transistor of the n field-effect transistors. One of a source and a drain of the k-th field-effect transistor (k is a natural number of greater than or equal to 2 and less than or equal to n) of the n field-effect transistors is electrically connected to the other of a source and a drain of the (k−1)-th field-effect transistor of the n field-effect transistors. One of the pair of electrodes of the m-th capacitor (m is a natural number of n or less) of the n capacitors is electrically connected to the other of a source and a drain of the m-th field-effect transistor of the n field-effect transistors. At least two of the n capacitors have different capacitance values.

Further, in one embodiment of the present invention, the above transistor is a transistor whose off-state current is lower than off-state current of a conventional transistor formed using silicon. Moreover, the transistor may include an oxide semiconductor layer which includes a region to which a dopant is added. By providing the region to which the dopant is added for the oxide semiconductor layer of the transistor, miniaturization of the transistor is achieved.

In one embodiment of the present invention, the oxide semiconductor layer of the transistor can be formed using a material (also referred to as a crystal with c-axis alignment or c-axis aligned crystal; CAAC) which is non-single-crystal and includes a phase which has a triangular, hexagonal, regular triangular, or regular hexagonal atomic arrangement when seen from the direction perpendicular to the a-b plane (also referred to as a plane of a layer) and in which metal atoms are arranged in a layered manner in the c-axis direction (also referred to as a thickness direction of a layer) or the metal atoms and oxygen atoms are arranged in a layered manner in the c-axis direction. In this case, deterioration of the transistor due to light is suppressed.

According to one embodiment of the present invention, a plurality of bits of data is written to a memory circuit by inputting a digital data signal to the memory circuit; thus, influence of noise on data to be written to the memory circuit can be reduced. Further, data of a digital data signal can be written to the memory circuit without the use of a signal conversion circuit such as a DA converter. By using a transistor with low off-state current, a data retention period can be lengthened.

BRIEF DESCRIPTION OF THE DRAWINGS

In the accompanying drawings.

DETAILED DESCRIPTION OF THE INVENTION

Examples of embodiments of the present invention will be described below with reference to the drawings. Note that it will be readily appreciated by those skilled in the art that details of the embodiments can be modified in various ways without departing from the spirit and scope of the present invention. The present invention is therefore not limited to the following description of the embodiments.

Note that the details of the embodiments can be combined with each other as appropriate. In addition, the details of the embodiments can be replaced with each other.

Ordinal numbers such as "first" and "second" are used in order to avoid confusion among components and the number of components is not limited by the number of ordinal numbers.

Embodiment 1

In this embodiment, an example of a semiconductor device that includes a memory circuit capable of storing data for a certain period is described.

Note that a memory circuit is a circuit capable of retaining electric charge as data for a certain period.

The example of the semiconductor device in this embodiment includes a memory circuit.

An example of the memory circuit is described with reference to FIGS. 1A to 1F.

Figure 1A:
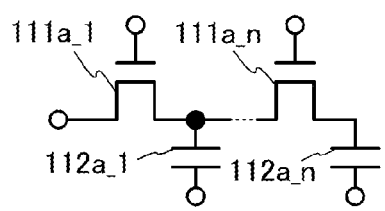
FIGS. 1A to 1F illustrate examples of a memory circuit in a semiconductor device in Embodiment 1.
Figure 1B:
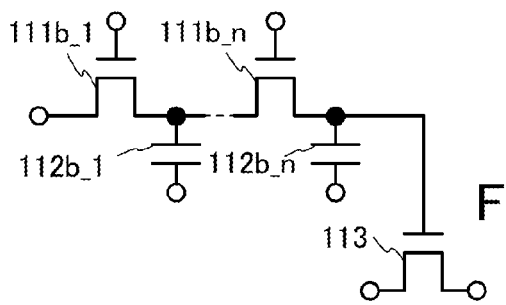

First, examples of a structure of the memory circuit in the semiconductor device in this embodiment are described with reference to FIGS. 1A and 1B. FIGS. 1A and 1B are circuit diagrams illustrating examples of the structure of the memory circuit in this embodiment.

The memory circuit illustrated in FIG. 1A includes n transistors $111a$ (transistors $111a\_1$ to $111a\_n$) (n is a natural number of 2 or more), and n capacitors $112a$ (capacitors $112a\_1$ to $112a\_n$).

Note that the transistor includes two terminals and a current control terminal for controlling current flowing between the two terminals by voltage applied. Note that without limitation to the transistor, in an element, terminals where current flowing therebetween is controlled are also referred to as current terminals. Two current terminals are also referred to as a pair of current terminals and such two current terminals are also referred to as a first current terminal and a second current terminal.

Further, a field-effect transistor can be used as the transistor, for example. In a field-effect transistor, a first current terminal, a second current terminal, and a current control terminal are one of a source and a drain, the other of the source and the drain, and a gate, respectively.

Depending on a structure or operation conditions of a transistor, a source and a drain of the transistor are interchanged in some cases.

Further, the capacitor includes a pair of electrodes and a dielectric layer overlapping with the pair of electrodes. Electric charge is accumulated in the capacitor in accordance with voltage applied between the pair of electrodes. Note that an electrode of a capacitor is also referred to as a capacitor electrode.

The term "voltage" generally means a difference between potentials at two points (also referred to as a potential difference). However, levels of voltage and potentials are represented by volts (V) in a circuit diagram or the like in some cases, so that it is difficult to distinguish them. Thus, in this specification, a potential difference between a potential at one point and a potential to be a reference (also referred to as a reference potential) is used as voltage at the point in some cases unless otherwise specified.

Note that as long as there exists a period during which two or more components are electrically connected, the two or more components can be said to be electrically connected.

One of a source and a drain of the k-th transistor $111a\_k$ (k is a natural number of greater than or equal to 2 and less than or equal to n) of the n transistors $111a$ is electrically connected to the other of a source and a drain of the (k−1)-th transistor $111a\_k-1$.

One of the pair of electrodes of the m-th capacitor $112a\_m$ (m is a natural number of n or less) is electrically connected to the other of a source and a drain of the m-th transistor $111a\_m$.

Note that the capacitance values of at least two of the n capacitors $112a$ are preferably different from each other. Further, the capacitance values of the n capacitors $112a$ may be different from each other. In that case, for example, the capacitance value of the k-th capacitor $112a\_k$ is preferably 2×K times or 1/(2×K) times as large as that of the (k−1)-th capacitor $112a\_k-1$ (K is a natural number).

The memory circuit illustrated in FIG. 1B includes n transistors $111b$ (transistors $111b\_1$ to $111b\_n$), n capacitors $112b$ (capacitors $112b\_1$ to $112b\_n$), and a transistor $113$.

One of a source and a drain of the k-th transistor $111b\_k$ (k is a natural number of greater than or equal to 2 and less than or equal to n) of the n transistors $111b$ is electrically connected to the other of a source and a drain of the (k−1)-th transistor $111b\_k-1$.

One of a pair of electrodes of the m-th capacitor $112b\_m$ (m is a natural number of n or less) is electrically connected to the other of a source and a drain of the m-th transistor $111b\_m$.

Note that the capacitance values of at least two of the n capacitors $112b$ are preferably different from each other. Further, the capacitance values of the n capacitors $112b$ may be different from each other. For example, the capacitance value of the k-th capacitor $112b\_k$ is preferably 2×K times or 1/(2×K) times as large as that of the (k−1)-th capacitor $112b\_k-1$.

A gate of the transistor $113$ is electrically connected to the other of a source and a drain of the n-th transistor $111b\_n$.

Further, the components of the memory circuits illustrated in FIGS. 1A and 1B are described.

The n transistors $111a$ and the n transistors $111b$ serve as selection transistors for determining whether or not data is retained.

As the n transistors $111a$ and the n transistors $111b$, transistors each including an oxide semiconductor layer in which a channel is formed can be used, for example.

The band gap of the oxide semiconductor layer is larger than that of silicon and for example, 2 eV or more, preferably 2.5 eV or more, far preferably 3 eV or more.

Further, such a transistor which includes the oxide semiconductor layer has lower off-state current than a conventional field-effect transistor which is formed using silicon.

It is possible to use, as the n transistors 111a and the n transistors 111b, transistors each of which includes an oxide semiconductor layer having a pair of regions which are separated from each other and to which a dopant is added. In the transistor which includes the oxide semiconductor layer having the pair of regions to which the dopant is added, a channel is formed between the pair of regions of the oxide semiconductor layer, to which the dopant is added. It is preferable that resistance of the pair of regions to which the dopant is added be lower than that of a region in which the channel is formed (also referred to as a channel formation region). With the use of the transistor which includes the oxide semiconductor layer having the pair of regions to which the dopant is added, resistance between the region in which the channel is formed (also referred to as the channel formation region) and a source or a drain of the transistor can be low, so that a reduction in the area of the transistor (also referred to as miniaturization of the transistor) is possible.

As the oxide semiconductor layer, it is possible to use, for example, a layer of a material which is non-single-crystal and includes a phase which has a triangular, hexagonal, regular triangular, or regular hexagonal atomic arrangement when seen from the direction perpendicular to the a-b plane and in which metal atoms are arranged in a layered manner in the c-axis direction or the metal atoms and oxygen atoms are arranged in a layered manner in the c-axis direction. By using an oxide semiconductor layer including CAAC as a layer in which a channel of a transistor is formed (also referred to as a channel formation layer), deterioration of the transistor due to light, for example, can be suppressed.

The n capacitors 112a and the n capacitors 112b serves as storage capacitors for retaining data.

As the transistor 113, for example, it is possible to use a transistor which includes a semiconductor layer including a semiconductor belonging to Group 14 of the periodic table (e.g., silicon) or the above oxide semiconductor layer as a layer in which a channel is formed.

The transistor 113 sets a value of data to be output. Note that the transistor 113 can be referred to as an output transistor, for example.

Note that the semiconductor layer including a semiconductor belonging to Group 14 may be a single crystal semiconductor layer, a polycrystalline semiconductor layer, a microcrystalline semiconductor layer, or an amorphous semiconductor layer.

Next, examples of methods for driving the memory circuits in FIGS. 1A and 1B are described.

Figure 1C:
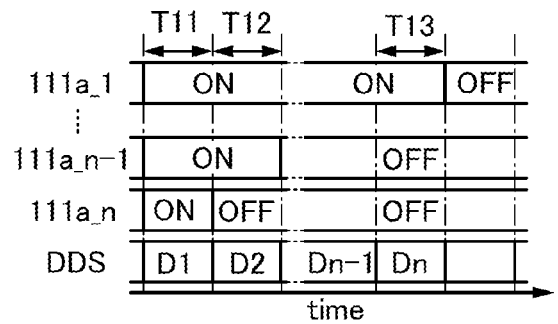
Figure 1D:
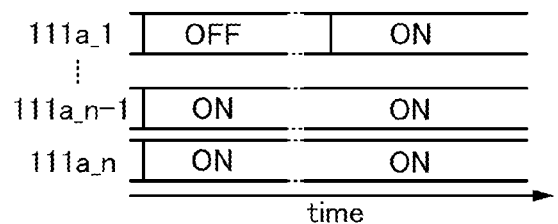

First, an example of a method for driving the memory circuit in FIG. 1A is described with reference to FIGS. 1C and 1D. FIGS. 1C and 1D are timing charts each illustrating an example of a method for driving the memory circuit in FIG. 1A. Note that here, for example, a binary (a high level and a low level) digital data signal is input to one of a source and a drain of the first transistor $111a\_1$ of the n transistors 111a. When the transistors $111a\_1$ to $111a\_n$ are n-channel transistors, the voltage of the other of the pair of electrodes of the m-th capacitor $112a\_m$ is set to a value smaller than or equal to a value of the reference potential, for example.

First, in the case where data is written to the memory circuit (writing to the memory circuit is performed), the transistors $111a\_1$ to $111a\_n$ are turned on. For example, the transistors $111a\_1$ to $111a\_n$ are turned on by changing the voltage of gates of the transistors $111a\_1$ to $111a\_n$. For example, the voltage of the gate of the m-th transistor $111a\_m$ (m is a natural number of n or less) may be controlled by inputting a pulse signal to the gate of the m-th transistor $111a\_m$.

When the transistors $111a\_1$ to $111a\_n$ are in an on state, a digital data signal (also referred to as a signal DDS) is input through sources and drains of the transistors $111a\_1$ to $111a\_n$, so that the voltage of one of the pair of electrodes of each of the capacitors $112a\_1$ to $112a\_n$ has a value based on the voltage of the digital data signal input.

For example, as illustrated in FIG. 1C, when the transistors $111a\_1$ to $111a\_n$ are turned on in a period T11, the voltage of one of the pair of electrodes of each of the capacitors $112a\_1$ to $112a\_n$ has a value (voltage D1 in FIG. 1C) based on the voltage of the digital data signal input.

Then, the transistor $111a\_n$ is turned off. At this time, the transistors $111a\_1$ to $111a\_n-1$ remain on.

When the transistors $111a\_1$ to $111a\_n-1$ are in an on state and the transistor $111a\_n$ is in an off state, a digital data signal is input through sources and drains of the transistors $111a\_1$ to $111a\_n-1$, so that the voltage of one of the pair of electrodes of each of the capacitors $112a\_1$ to $112a\_n-1$ has a value based on the voltage of the digital data signal input.

For example, as illustrated in FIG. 1C, when the transistor $111a\_n$ is turned off in a period T12, the voltage of one of the pair of electrodes of each of the capacitors $112a\_1$ to $112a\_n-1$ has a value (voltage D2 in FIG. 1C) based on the voltage of the digital data signal input.

Further, the transistors $111a\_n-2$ to $111a\_1$ are turned off in this order, and the voltage of one of the pair of electrodes of the capacitor $112a\_n-2$ to one of the pair of electrodes of the capacitor $112a\_1$ is set to a value based on the voltage of the digital data signal in this order. For example, the voltage of one of the pair of electrodes of the capacitor $112a\_n$ to the voltage of one of the pair of electrodes of the capacitor $112a\_1$ can be set to a value based on the voltage of data of a higher-order bit to a value based on the voltage of data of a lower-order bit in this order, or can be set to a value based on the voltage of data of a lower-order bit to a value based on the voltage of data of a higher-order bit in this order.

For example, as illustrated in FIG. 1C, the voltage of one of the pair of electrodes of the capacitor $112a\_1$ has a value (voltage Dn in FIG. 1C) based on the voltage of the digital data signal in a period T13.

Thus, data is written to the memory circuit.

In the case where data is read from the memory circuit (reading from the memory circuit is performed), for example, as illustrated in FIG. 1D, the transistor $111a\_1$ is turned off, and the transistors $111a\_2$ to $111a\_n$ are turned on.

When the transistor $111a\_1$ is in an off state and the transistors $111a\_2$ to $111a\_n$ are in an on state, the voltage of one of the pair of electrodes of each of the capacitors $112a\_1$ to $112a\_n-1$ changes in accordance with the capacitance ratio of the capacitors $112a\_1$ to $112a\_n$. For example, when the voltage of one of the pair of electrodes of each of the capacitors $112a\_1$ to $112a\_n-1$ has a value equivalent to or substantially equivalent to a value of the high-level voltage of the digital data signal, the voltage of one of the pair of electrodes of each of the capacitors $112a\_1$ to $112a\_n-1$ remains at the value equivalent to or substantially equivalent to the value of the high-level voltage of the digital data signal; when the voltage of one of the pair of electrodes of each of the capacitors $112a\_1$ to $112a\_n-1$ has a value equivalent to or substantially equivalent to a value of the low-level voltage of the digital data signal, the voltage of one of the pair of electrodes of each of the capacitors $112a\_1$ to $112a\_n-1$ remains at the value equivalent to or substantially equivalent to the value of the low-level voltage of the digital data signal; and when the voltage of one of the pair of electrodes of each of the capacitors $112a\_1$ to $112a\_n-1$ has another value, the voltage of one of the pair of electrodes of the capacitors $112a\_1$ to $112a\_n-1$ changes to have a value between the value of the high-level voltage and the value of the low-level voltage of the digital data signal.

For example, in the case where the number of the capacitors $112a$ is three (n=3) and a capacitance ratio of the capacitors $112a$ is 1:2:4, when the capacitor $112a\_1$ has a capacitance value of C, the capacitor $112a\_2$ has a capacitance value of 2C and the capacitor $112a\_3$ has a capacitance value of 4C. Further, when the voltage applied between the pair of electrodes of the capacitor $112a\_1$ is $V_{112\_1}$, electric charge accumulated in the capacitor $112a\_1$ is $C \times V_{112a\_1}$. In the case where data is read from the memory circuit, the total electric charge which is accumulated in the capacitors $112a\_1$ to $112a\_3$ when the transistors $111a\_1$ to $111a\_3$ are in an on state is $C \times (V_{112a\_3} \times 4 + V_{1112a\_2} \times 2 + V_{112a\_1})$. Since the total capacitance value of the capacitors $112a\_1$ to $112a\_3$ is 4C+2C+C, voltage applied to each of the capacitors $112a\_1$ to $112a\_3$ is $(V_{112a\_3} \times 4 + V_{112a\_2} \times 2 + V_{112a\_1})/7$.

Accordingly, the data read from the memory circuit has an analog value and is a plurality of bits of data (multilevel data).

In addition, the data can be read by turning on the transistor $111a\_1$.

The above is description of an example of a method for driving the memory circuit illustrated in FIG. 1A.

Figure 1E:
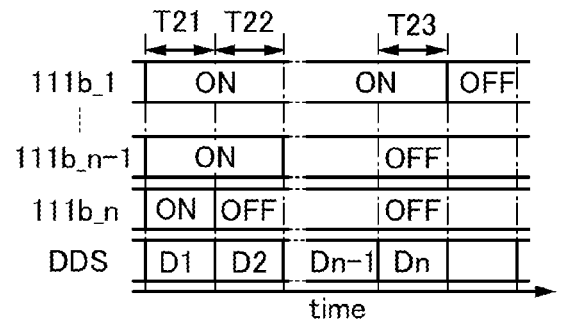
Figure 1F:
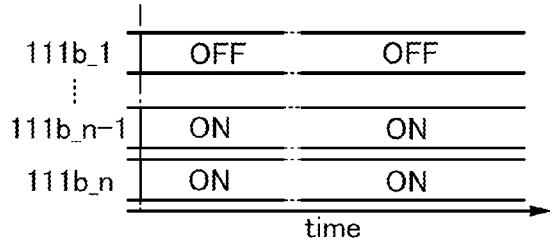

Next, an example of a method for driving the memory circuit in FIG. 1B is described with reference to FIGS. 1E and 1F. FIGS. 1E and 1F are timing charts each illustrating an example of a method for driving the memory circuit in FIG. 1B. Note that here, for example, a binary digital data signal is input to one of a source and a drain of the first transistor $111b\_1$ of the n transistors $111b$, and the voltage of one of a source and a drain of the transistor 113 is set to a value smaller than or equal to the value of the reference potential.

First, in the case where data is written to the memory circuit, the transistors $111b\_1$ to $111b\_n$ are turned on. For example, the transistors $111b\_1$ to $111b\_n$ are turned on by changing the voltage of gates of the transistors $111b\_1$ to $111b\_n$. At that time, in the case where the transistors $111b\_1$ to $111b\_n$ are n-channel transistors, the voltage of the other of the pair of electrodes of the m-th capacitor $112b\_m$ is set to a value smaller than or equal to a value of the reference potential, for example. For example, the voltage of the other of the pair of electrodes of the m-th capacitor $112b\_m$ may be controlled by inputting a pulse signal to the other of the pair of electrodes of the m-th capacitor $112b\_m$.

When the transistors $111b\_1$ to $111b\_n$ are in an on state, a digital data signal is input through sources and drains of the transistors $111b\_1$ to $111b\_n$, so that the voltage of one of the pair of electrodes of each of the capacitors $112b\_1$ to $112b\_n$ has a value based on the voltage of the digital data signal input.

For example, as illustrated in FIG. 1E, when the transistors $111b\_1$ to $111b\_n$ are turned on in a period T21, the voltage of one of the pair of electrodes of each of the capacitors $112b\_1$ to $112b\_n$ has the value (the voltage D1 in FIG. 1E) based on the voltage of the digital data signal input.

Then, the transistor $111b\_n$ is turned off. At this time, the transistors $111b\_1$ to $111b\_n-1$ remain on.

When the transistors $111b\_1$ to $111b\_n-1$ are in an on state and the transistor $111b\_n$ is in an off state, a digital data signal is input through the sources and the drains of the transistors $111b\_1$ to $111b\_n-1$, so that the voltage of one of the pair of electrodes of each of the capacitors $112b\_1$ to $112b\_n-1$ has a value based on the voltage of the digital data signal input.

For example, as illustrated in FIG. 1E, when the transistor $111b\_n$ is turned off in a period T22, the voltage of one of the pair of electrodes of each of the capacitors $112b\_1$ to $112b\_n-1$ has the value (the voltage D2 in FIG. 1E) based on the voltage of the digital data signal input.

Further, the transistors $111b\_n-2$ to $111b\_1$ are turned off in this order, and the voltage of one of the pair of electrodes of the capacitor $112b\_n-2$ to one of the pair of electrodes of the capacitor $112b\_1$ is set to a value based on the voltage of the digital data signal in this order. For example, the voltage of one of the pair of electrodes of the capacitor $112b\_n$ to the voltage of one of the pair of electrodes of the capacitor $112b\_1$ can be set to a value based on the voltage of data of a higher-order bit to a value based on the voltage of data of a lower-order bit in this order, or can be set to a value based on the voltage of data of a lower-order bit to a value based on the voltage of data of a higher-order bit in this order.

For example, as illustrated in FIG. 1E, the voltage of one of the pair of electrodes of the capacitor $112b\_1$ has the value (the voltage Dn in FIG. 1E) based on the voltage of the digital data signal in a period T23.

Thus, data is written to the memory circuit.

At this time, the gate of the transistor 113 is in a floating state, so that the voltage of the gate of the transistor 113 is held for a predetermined period.

In the case where data is read from the memory circuit as illustrated in FIG. 1F, the transistor $111b\_1$ is turned off, and the transistors $111b\_2$ to $111b\_n$ are turned on. Here, in the case where the transistors $111b\_1$ to $111b\_n$ are n-channel transistors, the voltage of the other of the pair of electrodes of the m-th capacitor $112b\_m$ is set to the reading voltage (e.g., high power supply voltage), for example.

When the transistor $111b\_1$ is in an off state and the transistors $111b\_2$ to $111b\_n$ are in an on state, the voltage of one of the pair of electrodes of each of the capacitors $112b\_1$ to $112b\_n$ changes in accordance with the capacitance ratio of the capacitors $112b\_1$ to $112b\_n$.

Resistance between the source and the drain of the transistor 113 depends on the voltage of the gate of the transistor 113. Therefore, the voltage having a value based on current that flows between the source and the drain of the transistor 113 can be read from the memory circuit as data. Further, during a period in which the transistor $111b\_1$ is in an off state, the voltage of the gate of the transistor 113 is held for a predetermined period; thus, the voltage having a value based on current that flows between the source and the drain of the transistor 113 can be read from the memory circuit as data more than once.

Accordingly, the data read from the memory circuit has an analog value and is a plurality of bits of data (multilevel data).

The above is description of an example of a method for driving the memory circuit illustrated in FIG. 1B.

The above is description of an example of the semiconductor device in this embodiment.

In an example of the semiconductor device in this embodiment, a memory circuit is formed with the use of a plurality of capacitors with different capacitance values which are electrically connected to each other through a source and a drain of a field-effect transistor. Thus, even in the case where data to be written to the memory circuit is a digital data signal, for example, a plurality of bits of data can be stored. Accordingly, a plurality of bits of data can be stored in one memory circuit without separately providing a DA converter. In addition, since data to be written to the memory circuit can be a digital data signal, influence of noise on a data signal can be reduced.

Further, in an example of the semiconductor device in this embodiment, the number of times written data can be read to one data writing operation can be increased by setting the voltage of a gate of a second field-effect transistor, which is electrically connected to a source or a drain of a first field-effect transistor serving as a selection transistor to a value based on the voltage of a data signal.

In addition, in an example of the semiconductor device in this embodiment, by using a field-effect transistor with low off-state current as the first field-effect transistor serving as the selection transistor, a data retention period can be lengthened. Therefore, even if a refresh operation is needed, for example, the number of times of refresh operations can be smaller; thus, power consumption can be reduced.

Embodiment 2

In this embodiment, an example of a semiconductor memory device is described as an example of the semiconductor device in the above embodiment.

An example of a semiconductor memory device in this embodiment includes a memory cell array including a plurality of memory cells arranged in a matrix of i rows (i is a natural number of 2 or more) and j columns (j is a natural number). The memory cell corresponds to the memory circuit in the semiconductor device in the above embodiment.

An example of the memory cell array in the semiconductor memory device in this embodiment is described with reference to FIGS. 2A to 2C.

First, an example of the circuit structure of the memory cell array in the semiconductor memory device in this embodiment is described with reference to FIG. 2A.

Figure 2A:
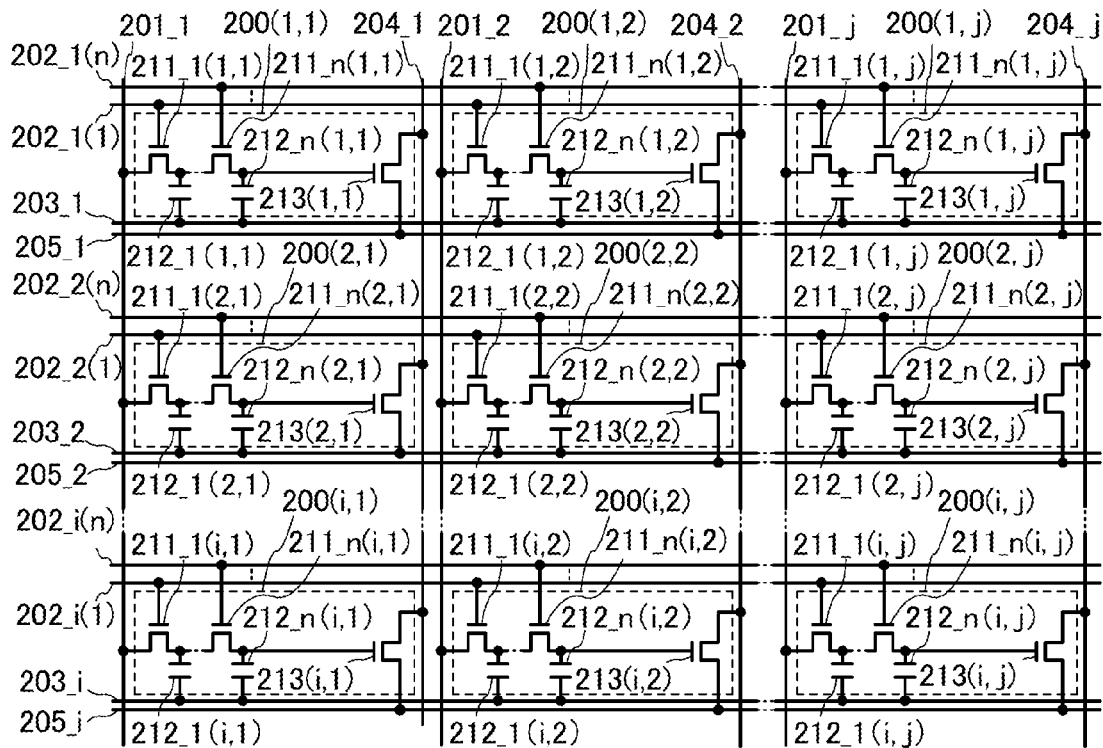
FIGS. 2A to 2C illustrate an example of a memory cell array in a semiconductor memory device in Embodiment 2.

A memory cell array illustrated in FIG. 2A includes a plurality of memory cells 200 arranged in a matrix of i rows and j columns; j wirings 201 (wirings 201_1 to 201_$j$); i×n wirings 202 (n wirings 202_1 to n wirings 202_$i$); i wirings 203 (wirings 203_1 to 203_$i$); j wirings 204 (wirings 204_1 to 204_$j$); and i wirings 205 (wirings 205_1 to 205_$i$). Note that in description of the memory cell array illustrated in FIG. 2A, i is a natural number of 4 or more and j is a natural number of 4 or more, for convenience.

The memory cell 200 stores data.

The voltage of the wirings 201_1 to 201_$j$ is controlled by, for example, a driver circuit including a decoder. The wirings 201_1 to 201_$j$ can be referred to as bit lines or data lines, for example.

The voltage of the n×i wirings 202 is controlled by, for example, a driver circuit including a decoder. The n×i wirings 202 can be referred to as word lines, for example.

The voltage of the wirings 203_1 to 203_$i$ is controlled by, for example, a driver circuit including a decoder. The wirings 203_1 to 203_$i$ can be referred to as capacitor lines or reading selection lines, for example.

The voltage of the wirings 204_1 to 204_$j$ is controlled by, for example, a driver circuit including a decoder. The wirings 204_1 to 204_$j$ can be referred to as data lines, for example.

Constant voltage is applied to the wirings 205_1 to 205_$i$, for example. The wirings 205_1 to 205_$i$ can be referred to as source lines, for example.

The memory cell 200 (M, N) in an M-th row (1 is a natural number of i or less) and an N-th column (N is a natural number of j or less) includes n transistors 211 (M, N) (transistors 211_1 (M, N) to 211_$n$ (M, N)), n capacitors 212 (M, N) (capacitors 212_1 (M, N) to 212_$n$ (M, N)), and a transistor 213 (M, N).

In the memory cell 200 (M, N) in the M-th row and the N-th column, the transistor 213 (M, N) is not necessarily provided. When the memory cell 200 (M, N) is not provided, the wirings 204_N and 205_M are not necessarily provided.

Of the n transistors 211 (M, N), one of a source and a drain of the first transistor 211_1 (M, N) is electrically connected to the wiring 201_N; one of a source and a drain of the k-th transistor 211_$k$ (M, N) (k is a natural number of greater than or equal to 2 and less than or equal to n) is electrically connected to the other of a source and a drain of the (k−1)-th transistor 211_$k$ (M, N); and a gate of the m-th transistor 211_$m$ (M, N) (m is a natural number of n or less) is electrically connected to the (M×m)-th wiring 202_M (m).

The n transistors 211 (M, N) serve as selection transistors which determine whether or not data is written.

As the n transistors 211 (M, N), a transistor that can be used as the n transistors 111$a$ or the n transistors 111$b$ in the semiconductor device in Embodiment 1 can be used.

One of a pair of electrodes of the m-th capacitor 212_$m$ (M, N) is electrically connected to the other of a source and a drain of the m-th transistor 211_$m$ (M, N); and the other of the pair of electrodes of the m-th capacitor 212_$m$ (M, N) is electrically connected to the M-th wiring 203_M.

Further, the capacitance values of at least two of the n capacitors 212 (M, N) are different from each other. Further, the capacitance values of the n capacitors 212 (M, N) may be different from each other. For example, the capacitance value of the k-th capacitor 212_$k$ (M, N) is preferably 2×K times or 1/(2×K) times as large as that of the (k−1)-th capacitor 212_$k$−1 (M, N) (K is a natural number).

The n capacitors 212 (M, N) serve as storage capacitors that store data.

A gate of the transistor 213 (M, N) is electrically connected to the other of a source and a drain of the n-th transistor 211_$n$ (M, N); one of a source and a drain of the transistor 213 (M, N) is electrically connected to the N-th wiring 204_N; and the other of the source and the drain of the transistor 213 (M, N) is electrically connected to the M-th wiring 205_M.

The transistor 213 (M, N) serves as an output transistor which sets a value of data to be output.

As the transistor 213 (M, N), a transistor that can be used as the transistor 113 in the semiconductor device in Embodiment 1 can be used.

The above is description of an example of a structure of the memory cell array illustrated in FIG. 2A.

Figure 3:
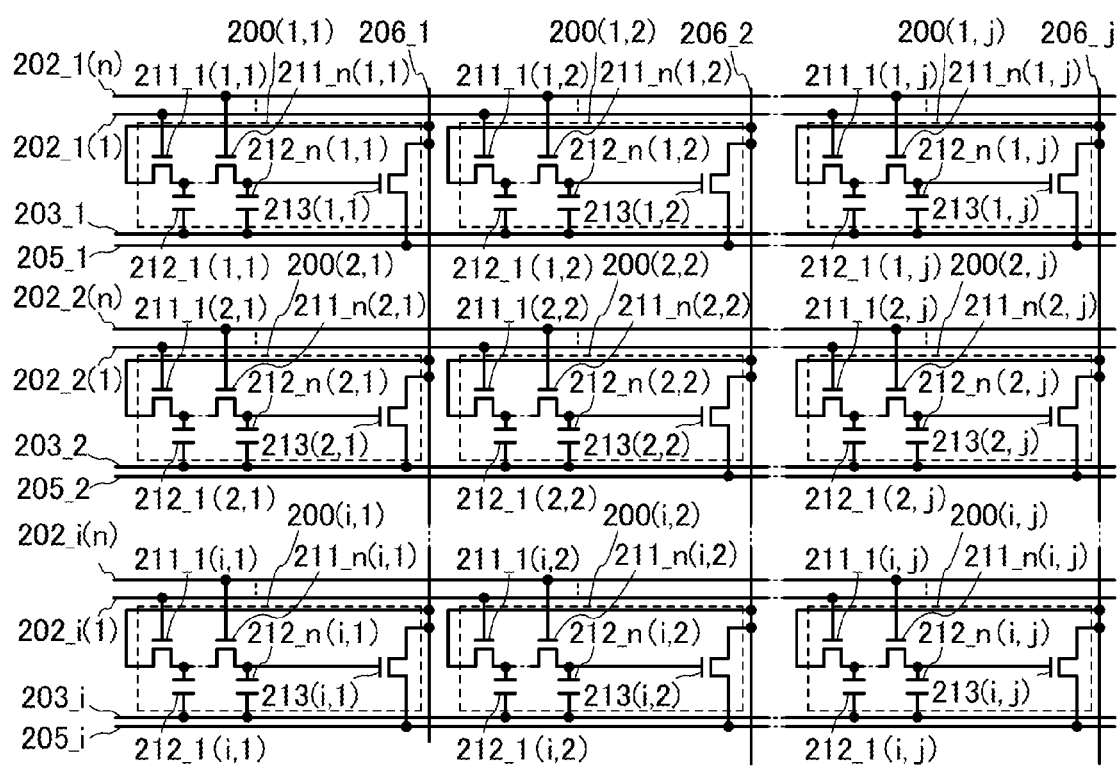
FIG. 3 illustrates an example of a memory cell array in a semiconductor memory device in Embodiment 2.

Note that the wiring 201_N and the wiring 204_N in FIG. 2A may be a common wiring. For example, in the semiconductor memory device illustrated in FIG. 3, a wiring 206_N is provided instead of the wiring 201_N and the wiring 204_N, and one of the source and the drain of the first transistor 211_1 (M, N) and one of the source and the drain of the transistor 213 (M, N) are electrically connected to the wiring 206_N. Since structures of the other components are similar to those illustrated in FIG. 2A, the description of the components is omitted. When the wiring 201_N and the wiring 204_N are a common wiring, the number of wirings can be reduced.

Further, an example of a method for driving the memory cell array in FIG. 2A is described with reference to FIGS. 2B and 2C. FIGS. 2B and 2C are timing charts each illustrating an example of a method for driving the memory cell array in FIG. 2A. Here, the case where data is sequentially written to the memory cells 200 (the memory cells 200 (M, 1) to 200 (M, N)) in the M-th row and then the data written is read is described as an example; however, the present invention is not limited to this example and data writing or data reading can be performed for the memory cells 200 individually.

First, in the case where data is written to the memory cells 200 in the M-th row, the transistors 211_1 to 211_n in each of the memory cells 200 in the M-th row are turned on. Note that at this time, it is preferable that the voltage of the other of a pair of electrodes of each of the capacitors 212_1 to 212_n in all the memory cells 200 have a value smaller than or equal to a value of the reference potential.

Figure 2B:
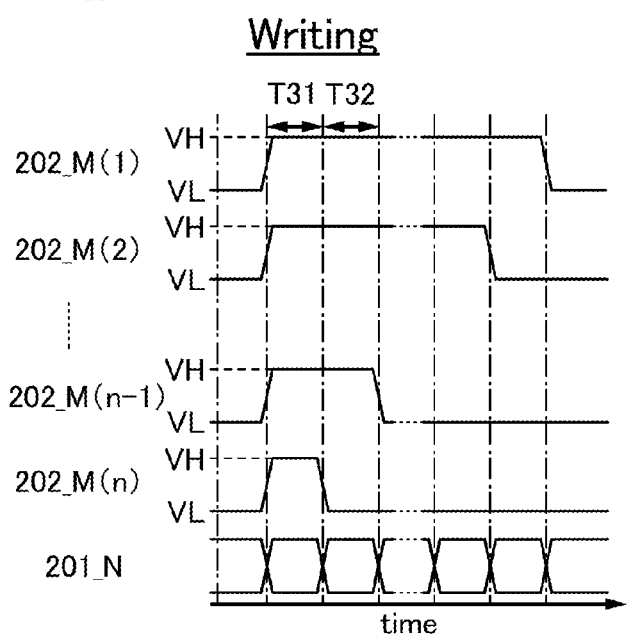

For example, in the case where the transistors 211_1 to 211_n in each of the memory cells 200 in the M-th row are n-channel transistors, by setting the voltage of the wirings 202_M (1) to 202_M (n) in the M-th row to voltage VH in a period T31 as illustrated in FIG. 2B, the transistors 211_1 to 211_n in each of the memory cells 200 in the M-th row can be turned on. The voltage VH is, for example, voltage having a larger value than the reference potential (e.g., high power supply voltage).

When the transistors 211_1 to 211_n in each of the memory cells 200 in the M-th row are in an on state, a digital data signal (also referred to as the signal DDS) is input through sources and drains of the transistors 211_1 to 211_n in each of the memory cells 200 in the M-th row, so that the voltage of one of the pair of electrodes of the m-th capacitor 212_m in each of the memory cells 200 in the M-th row has a value equivalent to or substantially equivalent to a value of the voltage of the (M×m)-th wiring 202_M (m).

Then, the transistor 211_n in each of the memory cells 200 in the M-th row is turned off. At this time, the transistors 211_1 to 211_n−1 in each of the memory cells 200 in the M-th row remain on.

When the transistor 211_n in each of the memory cells 200 in the M-th row remains off and the transistors 211_1 to 211_n−1 in each of the memory cells 200 in the M-th row remain on, a digital data signal is input through the sources and the drains of the transistors 211_1 to 211_n−1, so that the voltage of one of the pair of electrodes of the (k−1)-th capacitor 212_k−1 in each of the memory cells 200 in the M-th row has a value equivalent to or substantially equivalent to a value of the voltage of the (M×(k−1))-th wiring 202_M (k−1).

For example, in the case where the transistors 211_1 to 211_n in each of the memory cells 200 in the M-th row are n-channel transistors, by setting the voltage of the (M×n)-th wiring 202_M (n) to voltage VL in a period T32 as illustrated in FIG. 2B, the transistor 211_n in each of the memory cells 200 in the M-th row can be turned off. The voltage VL is, for example, lower than or equal to the reference potential.

Further, in each of the memory cells 200 in the M-th row, the transistors 211_n−2 to 211_1 are turned off in this order, and the voltage of one of the pair of electrodes of the capacitor 212_n−2 to one of the pair of electrodes of the capacitor 212_1 is set to a value based on the voltage of the digital data signal in this order. For example, the voltage of one of the pair of electrodes of the capacitor 212_n to the voltage of one of the pair of electrodes of the capacitor 212_1 can be set to a value based on the voltage of data of a higher-order bit to a value based on the voltage of data of a lower-order bit in this order, or can be set to a value based on the voltage of data of a lower-order bit to a value based on the voltage of data of a higher-order bit in this order.

Thus, data is written to the memory circuit.

At this time, gates of the transistors 213 are in a floating state, so that the voltage of the gates of the transistors 213 is held for a predetermined period.

In addition, when the above-described operation is repeatedly performed for the memory cells 200 in each row, data can be written to all the memory cells 200.

Further, in the case where data is read from the memory cells 200 in the M-th row, the transistor 211_1 in each of the memory cells 200 in the M-th row is turned off and the transistors 211_2 to 211_n in each of the memory cells 200 in the M-th row are turned on. Further, the voltage of the M-th wiring 203_M is set to voltage necessary for data reading and the voltage of the wirings 203_1 to 203_i other than the wiring 203_M in the M-th row is set equivalent to or substantially equivalent to the voltage of each of the wirings 204_1 to 204_j, whereby the data can be read only from the memory cells 200 in the M-th row.

Figure 2C:
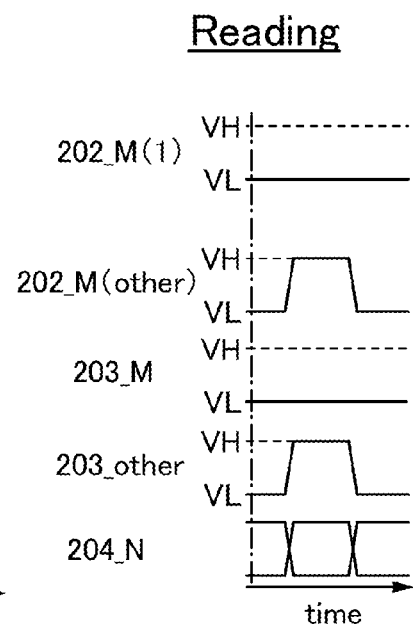

For example, in the case where the transistors 211_1 to 211_n and the transistors 213 (M, 1) to 213 (M, j) in the memory cells 200 in the M-th row are p-channel transistors, as illustrated in FIG. 2C, the voltage of the (M×1)-th wiring 202_M (1) is set to the voltage VL; the voltage of the (M×1)-th to (M×n)-th wirings 202_M (1) to 202_M (n) other than the wiring 202_M (1) (also referred to as the wiring 202_M (other)) is set to the voltage VH; the voltage of the wiring 203_M is set to the voltage VL; and the voltage of the wirings 203_1 to 203_i other than the wiring 203_M (also referred to as the wirings 203_other) is set to the voltage VH.

When the transistor 211_1 in each of the memory cells 200 in the M-th row is in an off state and the transistors 211_2 to 211_n in each of the memory cells 200 in the M-th row are in an on state, the voltage of one of the pair of electrodes of each of the capacitors 212_1 to 212_n changes in accordance with the capacitance ratio of the capacitors 212_1 to 212_n in each of the memory cells 200 in the M-th row.

Resistance between the source and the drain of each of the transistors 213 (M, 1) to 213 (M, j) in the memory cells 200 in the M-th row depends on the voltage of the gate of each of the transistors 213 (M, 1) to 213 (M, j). Further, the voltage having a value based on current that flows between the source and the drain of each of the transistors 213 (M, 1) to 213 (M, j) can be read from the memory circuit as data.

Further, during a period in which the transistor 211_1 is in an off state, the voltage of the gate of the transistor 213 is held for a predetermined period; thus, the voltage having a value based on current that flows between the source and the drain of the transistor 213 can be read from the memory circuit as data more than once.

Accordingly, the data read from the memory circuit has an analog value and is a plurality of bits of data (multilevel data).

In addition, when the above-described operation is repeatedly performed for the memory cells 200 in each row, the data can be read from all the memory cells (the memory cells 200 (1, 1) to 200 (i, j)). The above is description of an example of a method for driving the semiconductor memory device illustrated in FIG. 2A.

In an example of the semiconductor memory device in this embodiment, a plurality of memory cells are formed with the use of a plurality of capacitors with different capacitance values which are electrically connected to each other through a source and a drain of a field-effect transistor. Thus, even in the case where data to be written to the memory cell is a digital data signal, for example, a plurality of bits of data can be stored in the plurality of memory cells selectively. Accordingly, a plurality of bits of data can be stored in one memory circuit without separately providing a DA converter. In addition, since data to be written to the memory circuit can be a digital data signal, influence of noise on a data signal can be reduced.

Further, in an example of the semiconductor memory device in this embodiment, the number of times written data can be read to one data writing operation can be increased by setting the voltage of a gate of a second field-effect transistor, which is electrically connected to a source or a drain of the n-th first field-effect transistor serving as a selection transistor to a value based on the voltage of a data signal.

In addition, in an example of the semiconductor memory device in this embodiment, by using a field-effect transistor with low off-state current as the n first field-effect transistors serving as the selection transistors, a data retention period can be lengthened. Therefore, even if a refresh operation is needed, for example, the number of times of refresh operations can be smaller; thus, power consumption can be reduced.

Embodiment 3

In this embodiment, an example of a transistor including an oxide semiconductor layer which can be used for a semiconductor device or a semiconductor memory device in the above embodiment is described.

Examples of structures of the transistors in this embodiment are described with reference to FIGS. 4A to 4D. FIGS. 4A to 4D are cross-sectional schematic views each illustrating an example of a structure of a transistor in this embodiment. Note that the components illustrated in FIGS. 4A to 4D include those having sizes different from the actual sizes.

Figure 4A:
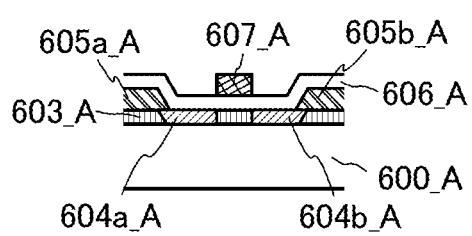
FIGS. 4A to 4D are cross-sectional schematic views each illustrating an example of a structure of a transistor in Embodiment 3.

A transistor illustrated in FIG. 4A is one of top-gate transistors.

The transistor illustrated in FIG. 4A includes a semiconductor layer 603_A, a conductive layer 605a_A, a conductive layer 605b_A, an insulating layer 606_A, and a conductive layer 607_A.

The semiconductor layer 603_A includes a region 604a_A and a region 604b_A that are regions which are separated from each other and to which a dopant is added. A region between the region 604a_A and the region 604b_A serves as a channel formation region. The semiconductor layer 603_A is provided over an element formation layer 600_A, for example.

The conductive layer 605a_A is provided over the semiconductor layer 603_A and is electrically connected to the semiconductor layer 603_A. Further, a side surface of the conductive layer 605a_A is tapered and the conductive layer 605a_A partly overlaps with the region 604a_A; however, the present invention is not necessarily limited thereto. When the conductive layer 605a_A partly overlaps with the region 604a_A, resistance between the conductive layer 605a_A and the region 604a_A can be low. Further, an entire region of the semiconductor layer 603_A, which overlaps with the conductive layer 605a_A may be the region 604a_A.

The conductive layer 605b_A is provided over the semiconductor layer 603_A and is electrically connected to the semiconductor layer 603_A. Further, a side surface of the conductive layer 605b_A is tapered and the conductive layer 605b_A partly overlaps with the region 604b_A; however, the present invention is not necessarily limited thereto. When the conductive layer 605b_A partly overlaps with the region 604b_A, resistance between the conductive layer 605b_A and the region 604b_A can be low. Further, an entire region of the semiconductor layer 603_A, which overlaps with the conductive layer 605b_A may be the region 604b_A.

The insulating layer 606_A is provided over the semiconductor layer 603_A, the conductive layer 605a_A, and the conductive layer 605b_A.

The conductive layer 607_A overlaps with the semiconductor layer 603_A with the insulating layer 606_A interposed therebetween. A region of the semiconductor layer 603_A, which overlaps with the conductive layer 607_A with the insulating layer 606_A interposed therebetween serves as the channel formation region.

Figure 4B:
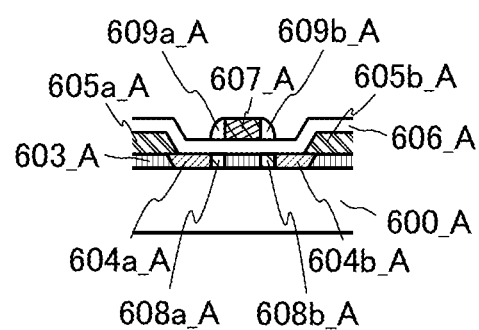

A transistor illustrated in FIG. 4B has the structure illustrated in FIG. 4A to which an insulating layer 609a_A and an insulating layer 609b_A are added; moreover, the semiconductor layer 603_A includes, between the region 604a_A and the region 604b_A, a region 608a_A and a region 608b_A that are regions which are separated from each other and to which a dopant is added.

The insulating layer 609a_A is provided over the insulating layer 606_A and is in contact with one of a pair of side surfaces of the conductive layer 607_A which face each other.

The insulating layer 609b_A is provided over the insulating layer 606_A and is in contact with the other of the pair of side surfaces of the conductive layer 607_A which face each other.

The region 608a_A overlaps with the insulating layer 609a_A with the insulating layer 606_A interposed therebetween. Further, the concentration of the dopant of the region 608a_A may be lower than that of the dopant of the region 604a_A and the region 604b_A. In that case, the region 608a_A is also referred to as a low concentration region.

The region 608b_A overlaps with the insulating layer 609b_A with the insulating layer 606_A interposed therebetween. Further, the concentration of the dopant of the region 608b_A may be lower than that of the dopant of the region 604a_A and the region 604b_A. In that case, the region 608b_A is also referred to as a low concentration region. Further, in that case, the region 604a_A and the region 604b_A may be referred to as high concentration regions.

When the region 608a_A and the region 608b_A are provided, local electric field concentration on the transistor can be suppressed and the reliability of the transistor can be increased even when the area of the transistor is small.

Figure 4C:
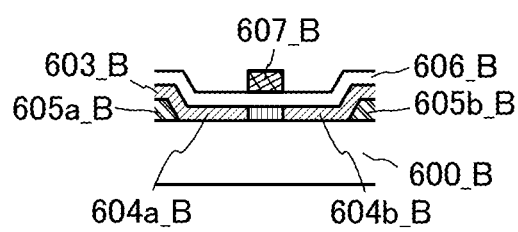

A transistor illustrated in FIG. 4C is one of top-gate transistors.

The transistor illustrated in FIG. 4C includes a semiconductor layer 603_B, a conductive layer 605a_B, a conductive layer 605b_B, an insulating layer 606_B, and a conductive layer 607_B.

The conductive layer 605a_B is provided over an element formation layer 600_B. Further, a side surface of the conductive layer 605a_B is tapered.

The conductive layer 605b_B is provided over the element formation layer 600_B. Further, a side surface of the conductive layer 605b_B is tapered.

The semiconductor layer 603_B includes a region 604a_B and a region 604b_B that are regions which are separated from each other and to which a dopant is added. A region between the region 604a_B and the region 604b_B serves as a channel formation region. The semiconductor layer 603_B is provided over the conductive layer 605a_B, the conductive layer 605b_B, and the element formation layer 600_B, for example.

The region 604a_B is electrically connected to the conductive layer 605a_B.

The region 604b_B is electrically connected to the conductive layer 605b_B.

The insulating layer 606_B is provided over the semiconductor layer 603_B.

The conductive layer 607_B overlaps with the semiconductor layer 603_B with the insulating layer 606_B interposed therebetween. A region of the semiconductor layer 603_B, which overlaps with the conductive layer 607_B with the insulating layer 606_B interposed therebetween serves as the channel formation region.

Figure 4D:
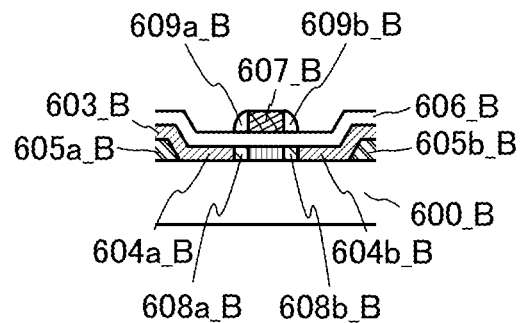

A transistor illustrated in FIG. 4D has the structure illustrated in FIG. 4C to which an insulating layer 609a_B and an insulating layer 609b_B are added; moreover, the semiconductor layer 603_B includes, between the region 604a_B and the region 604b_B, a region 608a_B and a region 608b_B that are regions which are separated from each other and to which a dopant is added.

The insulating layer 609a_B is provided over the insulating layer 606_B and is in contact with one of a pair of side surfaces of the conductive layer 607_B which face each other.

The insulating layer 609b_B is provided over the insulating layer 606_B and is in contact with the other of the pair of side surfaces of the conductive layer 607_B which face each other.

The region 608a_B overlaps with the insulating layer 609a_B with the insulating layer 606_B interposed therebetween. Further, the concentration of the dopant of the region 608a_B may be lower than that of the dopant of the region 604a_B and the region 604b_B. In that case, the region 608a_B is also referred to as a low concentration region.

The region 608b_B overlaps with the insulating layer 609b_B with the insulating layer 606_B interposed therebetween. Further, the concentration of the dopant of the region 608b_B may be lower than that of the dopant of the region 604a_B and the region 604b_B. In that case, the region 608b_B is also referred to as a low concentration region. Further, in that case, the region 604a_B and the region 604b_B may be referred to as high concentration regions.

When the region 608a_B and the region 608b_B are provided, local electric field concentration on the transistor can be suppressed and the reliability of the transistor can be increased.

Next, the components illustrated in FIGS. 4A to 4D are described.

As the element formation layer 600_A and the element formation layer 600_B, insulating layers, substrates having insulating surfaces, or the like can be used, for example. Further, layers over which elements are formed in advance can be used as the element formation layer 600_A and the element formation layer 600_B.

The semiconductor layer 603_A and the semiconductor layer 603_B serve as channel formation layers of the transistors. As the semiconductor layer 603_A and the semiconductor layer 603_B, an oxide semiconductor layer containing four-component metal oxide, three-component metal oxide, two-component metal oxide, or the like can be used.

As the four-component metal oxide, an In—Sn—Ga—Zn—O-based metal oxide or the like can be used, for example.

As the three-component metal oxide, an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, or the like can be used, for example.

As the two-component metal oxide, an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, an In—Sn—O-based metal oxide, or an In—Ga—O-based metal oxide can be used, for example.

In the case where an In—Zn—O-based metal oxide is used, for example, an oxide target having the following composition ratios can be used for formation of an In—Zn—O-based metal oxide semiconductor layer: In:Zn=50:1 to 1:2 (In$_2$O$_3$:ZnO=25:1 to 1:4 in a molar ratio), preferably In:Zn=20:1 to 1:1 (In$_2$O$_3$:ZnO=10:1 to 1:2 in a molar ratio), more preferably In:Zn=15:1 to 1.5:1 (In$_2$O$_3$:ZnO=15:2 to 3:4 in a molar ratio). For example, when the atomic ratio of the target used for the formation of the In—Zn—O-based oxide semiconductor is expressed by In:Zn:O=P:Q:R, R>1.5P+Q. The increase in the In content can make the mobility of the transistor higher.

Further, as the semiconductor layer 603_A and the semiconductor layer 603_B, a layer containing an In—O-based metal oxide, a Sn—O-based metal oxide, or a Zn—O-based metal oxide, or the like can be used, for example. The metal oxide which can be used for the oxide semiconductor may contain silicon oxide. The metal oxide which can be used for the oxide semiconductor may contain nitrogen.

As the semiconductor layer 603_A and the semiconductor layer 603_B, a layer containing a material represented by InLO$_3$(ZnO)$_l$ (l is a number of greater than 0) can be used. Here, L in InLO$_3$(ZnO)$_l$ represents one or more metal elements selected from Ga, Al, Mn, and Co.

At least regions of the semiconductor layer 603_A and the semiconductor layer 603_B, in which the channels are formed may be non-single-crystal and include a phase which has a triangular, hexagonal, regular triangular, or regular hexagonal atomic arrangement when seen from the direction perpendicular to the a-b plane and in which metal atoms are arranged in a layered manner in the c-axis direction or the metal atoms and oxygen atoms are arranged in a layered manner in the c-axis direction.

A dopant imparting one conductivity type is added to the region 604a_A and the region 604a_B, and the region 604a_A and the region 604a_B serve as one of a source and a drain of a transistor. Note that a region serving as a source of a transistor is also referred to as a source region, and a region serving as a drain of a transistor is also referred to as a drain region.

A dopant imparting one conductivity type is added to the region 604b_A and the region 604b_B, and the region 604b_A and the region 604b_B serve as the other of the source and the drain of the transistor.

The region 608a_A, the region 608b_A, the region 608a_B, and the region 608b_B may have lower resistance than the channel formation regions, and have higher resistance than the region 604a_A, the region 604b_A, the region 604a_, and the region 604b_B. Note that the region 608a_A, the region 608b_A, the region 608a_B, and the region 608b_B are also referred to as low-resistance regions.

As the dopants contained in the region 604a_A, the region 604b_A, the region 608a_A, the region 608b_A, the region 604a_B, the region 604b_B, the region 608a_B, and the region 608b_B, for example, one or more elements selected from elements belonging to Group 15 of the periodic table (e.g., one or more of nitrogen, phosphorus, and arsenic) and rare gas elements (e.g., one or more of helium, argon, and xenon) can be given.

The concentration of the dopants contained in the region 604a_A, the region 604b_A, the region 604a_B, and the region 604b_B is preferably $5\times10^{19}$ cm$^{-3}$ or higher, for example. For example, the region 604a_A, the region 604b_A, the region 604a_B, and the region 604b_B may contain nitrogen at a concentration of higher than or equal to $1\times10^{20}$ cm$^{-3}$ and lower than 7 atomic %.

The concentration of the dopants contained in the region 608a_A, the region 608b_A, the region 608a_B, and the region 608b_B is preferably higher than or equal to $5\times10^{18}$ cm$^{-3}$ and lower than $5\times10^{19}$ cm$^{-3}$, for example.

In addition, the region 604a_A, the region 604b_A, the region 608a_A, the region 608b_A, the region 604a_B, the region 604b_B, the region 608a_B, and the region 608b_B may have lower crystallinity than the channel formation regions.

Further, the region 604a_A, the region 604b_A, the region 604a_B, and the region 604b_B may contain a crystal having a wurtzite structure.

Further, the region 608a_A, the region 608b_A, the region 608a_B, and the region 608b_B may contain a crystal having a wurtzite structure.

For example, the region 604a_A, the region 604b_A, the region 608a_A, the region 608b_A, the region 604a_B, the region 604b_B, the region 608a_B, and the region 608b_B can contain a crystal having a wurtzite structure by heat treatment after the addition of the dopants.

When the region to which the dopant is added contains a crystal having a wurtzite structure, resistance between the channel formation region and the source or drain of the transistor can be low.

The conductive layer 605a_A, the conductive layer 605a_B, the conductive layer 605b_A, and the conductive layer 605b_B serve as the source or the drain of the transistor. Note that a layer serving as a source of a transistor is also referred to as a source electrode or a source wiring, and a layer serving as a drain of a transistor is also referred to as a drain electrode or a drain wiring.

Each of the conductive layer 605a_A, the conductive layer 605a_B, the conductive layer 605b_A, and the conductive layer 605b_B can be, for example, a layer of a metal material such as aluminum, chromium, copper, tantalum, titanium, molybdenum, or tungsten; or an alloy material which contains any of the above metal materials as a main component. As a layer of an alloy material, a layer of a Cu—Mg—Al alloy material can be used, for example.

Further, each of the conductive layer 605a_A, the conductive layer 605a_B, the conductive layer 605b_A, and the conductive layer 605b_B can be a layer containing conductive metal oxide. Note that silicon oxide may be contained in conductive metal oxide that can be used for the conductive layer 605a_A, the conductive layer 605a_B, the conductive layer 605b_A, and the conductive layer 605b_B.

Further, each of the conductive layer 605a_A, the conductive layer 605a_B, the conductive layer 605b_A, and the conductive layer 605b_B can be formed by stacking layers formed using materials that can be used for the conductive layer 605a_A, the conductive layer 605a_B, the conductive layer 605b_A, and the conductive layer 605b_B. For example, when each of the conductive layer 605a_A, the conductive layer 605a_B, the conductive layer 605b_A, and the conductive layer 605b_B is formed by stacking a layer of copper over a layer of a Cu—Mg—Al alloy material, the conductive layer 605a_A, the conductive layer 605a_B, the conductive layer 605b_A, and the conductive layer 605b_B can have high adhesiveness with a layer which is in contact therewith.

As the insulating layer 606_A and the insulating layer 606_B, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. Further, each of the insulating layer 606_A and the insulating layer 606_B can be formed by stacking layers formed using materials that can be used for the insulating layer 606_A and the insulating layer 606_B.

Alternatively, as each of the insulating layer 606_A and the insulating layer 606_B, an insulating layer of a material containing an element that belongs to Group 13 of the periodic table and oxygen element can be used, for example.

Examples of the material containing an element that belongs to Group 13 and oxygen element include gallium oxide, aluminum oxide, aluminum gallium oxide, and gallium aluminum oxide. Note that aluminum gallium oxide is a substance in which the amount of aluminum is larger than that of gallium in atomic percent, and gallium aluminum oxide is a substance in which the amount of gallium is larger than or equal to that of aluminum in atomic percent.

The conductive layer 607_A and the conductive layer 607_B serve as gates of the transistors. Note that such a conductive layer serving as a gate of the transistor is also referred to as a gate electrode or a gate wiring.

Each of the conductive layer 607_A and the conductive layer 607_B can be, for example, a layer of a metal material such as aluminum, chromium, copper, tantalum, titanium, molybdenum, or tungsten; or an alloy material which contains any of the above metal materials as a main component. Further, each of the conductive layer 607_A and the conductive layer 607_B can be formed by stacking layers formed using materials that can be used for the conductive layer 607_A and the conductive layer 607_B.

Further, each of the conductive layer 607_A and the conductive layer 607_B can be a layer containing conductive metal oxide. Note that silicon oxide may be contained in conductive metal oxide that can be used for the conductive layer 607_A and the conductive layer 607_B.

Further, a layer of an In—Ga—Zn—O-N-based material can be used as the conductive layer 607_A and the conductive layer 607_B. A layer of an In—Ga—Zn—O—N-based material has high conductivity and is thus suitable for the conductive layer 607_A and the conductive layer 607_B.

As the insulating layer 609a_A, the insulating layer 609b_A, the insulating layer 609a_B, and the insulating layer 609b_B, for example, a layer of a material that can be used for the insulating layer 606_A and the insulating layer 606_B can be used. Further, each of the insulating layer 609a_A, the insulating layer 609b_A, the insulating layer 609a_B, and the insulating layer 609b_B can be formed by stacking layers formed using materials that can be used for the insulating layer 609a_A, the insulating layer 609b_A, the insulating layer 609a_B, and the insulating layer 609b_B.

Note that an insulating layer may be further provided over the insulating layer 606_A with the conductive layer 607_A interposed therebetween or over the insulating layer 606_B with the conductive layer 607_B interposed therebetween.

Note that it is possible to suppress incidence of light on the semiconductor layer when the transistor in this embodiment has a structure in which the entire semiconductor layer overlaps with the conductive layer serving as the gate electrode. In this case, the region to which the dopant is added is not necessarily provided in the semiconductor layer.

The above is description of a structure example of each of the transistors illustrated in FIGS. 4A to 4D.

Next, as an example of a method for manufacturing the transistor in this embodiment, an example of a method for manufacturing the transistor illustrated in FIG. 4A will be described with reference to FIGS. 5A to 5E. FIGS. 5A to 5E are cross-sectional schematic views illustrating an example of a method for manufacturing the transistor in this embodiment.

Figure 5A:
FIGS. 5A to 5E are cross-sectional schematic views illustrating an example of a method for manufacturing a transistor in Embodiment 3.

First, as illustrated in FIG. 5A, the semiconductor layer 603_A is formed over the element formation layer 600_A.

An example of a method for forming an oxide semiconductor layer including CAAC as an example of the semiconductor layer 603_A is described below.

An example of the method for forming an oxide semiconductor layer including CAAC includes a step of forming a semiconductor film over the element formation layer 600_A. Note that in an example of a method for forming the semiconductor layer 603_A, one of or both a step of performing heat treatment once or more than once and a step of removing part of the semiconductor film may be included. In that case, a timing of the step of removing part of the semiconductor film is not particularly limited as long as the step is performed after formation of the semiconductor film before formation of the conductive layer 605a_A and the conductive layer 605b_A. Further, a timing of the step of performing the heat treatment is not particularly limited as long as the step is performed after formation of the semiconductor film.

In the step of forming the semiconductor film over the element formation layer 600_A, for example, the semiconductor film is formed by formation of a film of a material that can be used for the semiconductor layer 603_A by sputtering. At this time, the temperature of the element formation layer over which the semiconductor film is formed is set to higher than or equal to 100° C. and lower than or equal to 500° C., preferably higher than or equal to 200° C. and lower than or equal to 350° C. With a high temperature of the element formation layer over which the semiconductor film is formed, the semiconductor film can include a phase which has a triangular, hexagonal, regular triangular, or regular hexagonal atomic arrangement when seen from the direction perpendicular to the a-b plane and in which metal atoms are arranged in a layered manner in the c-axis direction or the metal atoms and oxygen atoms are arranged in a layered manner in the c-axis direction.

In the step of performing the heat treatment, heat treatment (also referred to as heat treatment A) is performed at higher than or equal to 400° C. and lower than or equal to 750° C., or higher than or equal to 400° C. and lower than the strain point of the substrate, for example. Note that a timing of the heat treatment A is not particularly limited as long as the heat treatment is performed after formation of the semiconductor film.

By the heat treatment A, the crystallinity of the semiconductor layer 603_A can be increased.

Note that a heat treatment apparatus for the heat treatment A can be an electric furnace or an apparatus for heating an object by heat conduction or heat radiation from a heater such as a resistance heater. For example, an RTA (rapid thermal annealing) apparatus such as a GRTA (gas rapid thermal annealing) apparatus, or an LRTA (lamp rapid thermal annealing) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the high-temperature gas, for example, a rare gas or an inert gas (e.g., nitrogen) which does not react with an object by heat treatment can be used.

After the heat treatment A, a high-purity oxygen gas, a high-purity $N_2O$ gas, or ultra-dry air (with a dew point of $-40°$ C. or lower, preferably $-60°$ C. or lower) may be introduced into the furnace that has been used in the heat treatment A while the heating temperature is maintained or decreased. In that case, it is preferable that water, hydrogen, and the like be not contained in the oxygen gas or the $N_2O$ gas. The purity of the oxygen gas or the $N_2O$ gas which is introduced into the heat treatment apparatus is preferably 6N or higher, more preferably 7N or higher. That is, the impurity concentration in the oxygen gas or the $N_2O$ gas is 1 ppm or lower, preferably 0.1 ppm or lower. By the action of the oxygen gas or the $N_2O$ gas, oxygen is supplied to the semiconductor film or the semiconductor layer 603_A, so that defects caused by oxygen deficiency in the semiconductor film or the semiconductor layer 603_A can be reduced.

Figure 5B:
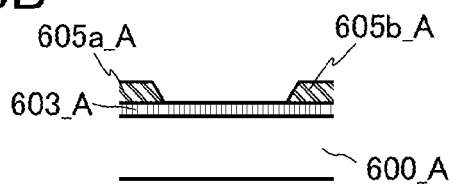

Then, as illustrated in FIG. 5B, a first conductive film is formed over part of the semiconductor layer 603_A and is partly etched, so that the conductive layer 605a_A and the conductive layer 605b_A are formed.

For example, the first conductive film can be formed by formation of a film formed using a material that can be used for the conductive layer 605a_A and the conductive layer 605b_A by sputtering or the like. Alternatively, the first conductive film can be formed by stacking films formed using materials that can be used for the conductive layer 605a_A and the conductive layer 605b_A.

In the case where a film is partly etched in the example of the method for manufacturing a transistor in this embodiment as in formation of the conductive layer 605a_A and the conductive layer 605b_A, the film may be etched in such a manner that a resist mask is formed over part of the film through photolithography and is used, for example. Note that in that case, the resist mask is preferably removed after the etching. In addition, the resist mask may be formed using an exposure mask having a plurality of regions with different light transmittances (such an exposure mask is also referred to as a multi-tone mask). With the multi-tone mask, a resist mask having a plurality of regions with different thicknesses can be formed, so that the number of resist masks used for the formation of the transistor can be reduced.

Figure 5C:
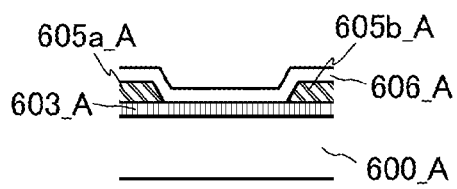

Next, as illustrated in FIG. 5C, the insulating layer 606_A is formed by formation of a first insulating film over the semiconductor layer 603_A, the conductive layer 605a_A, and the conductive layer 605b_A. The first insulating film can be formed by stacking films formed using materials that can be used for the insulating layer 606_A.

For example, the first insulating film can be formed by formation of a film formed using a material that can be used for the insulating layer 606_A by sputtering, plasma-enhanced CVD, or the like. Further, when the film formed using a material that can be used for the insulating layer 606_A is formed by high-density plasma-enhanced CVD (e.g., high-density plasma-enhanced CVD using microwaves (e.g., microwaves with a frequency of 2.45 GHz)), the insulating layer 606_A can be dense and can have higher breakdown voltage.

Figure 5D:
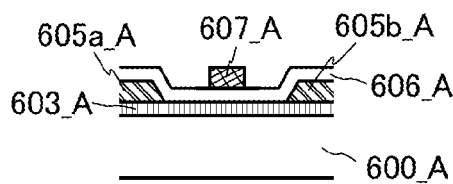

Then, as illustrated in FIG. 5D, a second conductive film is formed over the insulating layer 606_A and is partly etched, so that the conductive layer 607_A is formed.

For example, the second conductive film can be formed by formation of a film formed using a material that can be used for the conductive layer 607_A by sputtering. Alternatively, the second conductive film can be formed by stacking films formed using materials that can be used for the second conductive film.

Note that when a high-purity gas from which an impurity such as hydrogen, water, a hydroxyl group, or hydride is removed is used as a sputtering gas, for example, the impurity concentration in the film can be lowered.

Note that heat treatment (also referred to as heat treatment B) may be performed in a preheating chamber of a sputtering apparatus before the film is formed by sputtering. By the heat treatment B, an impurity such as hydrogen or moisture can be eliminated.

Before the film is formed by sputtering, for example, treatment in which voltage is applied not to a target side but to a substrate side in an argon, nitrogen, helium, or oxygen atmosphere with the use of an RF power and plasma is generated so that a surface on which the film is formed is modified (such treatment is also referred to as reverse sputtering) may be performed. By reverse sputtering, powdery substances (also referred to as particles or dust) that attach onto the surface on which the film is formed can be removed.

In the case where the film is formed by sputtering, moisture remaining in a deposition chamber for the film can be removed by an adsorption vacuum pump or the like. A cryopump, an ion pump, a titanium sublimation pump, or the like can be used as the adsorption vacuum pump. Alternatively, moisture remaining in the deposition chamber can be removed by a turbo-molecular pump provided with a cold trap.

Further, after the insulating layer 606_A is formed, heat treatment (also referred to as heat treatment C) may be performed in an inert gas atmosphere or an oxygen gas atmosphere. At this time, the heat treatment C can be performed at higher than or equal to 200° C. and lower than or equal to 400° C., preferably higher than or equal to 250° C. and lower than or equal to 350° C., for example.

Figure 5E:
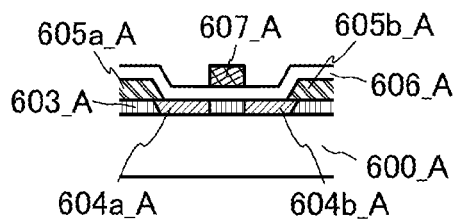

Then, as illustrated in FIG. 5E, a dopant is added to the semiconductor layer 603_A from a side on which the conductive layer 607_A is formed, so that the region 604a_A and the region 604b_A are formed in a self-aligned manner through the insulating layer 606_A.

For example, the dopant can be added with the use of an ion doping apparatus or an ion implantation apparatus.

As the dopant to be added, for example, one or more elements selected from elements belonging to Group 15 of the periodic table (e.g., one or more of nitrogen, phosphorus, and arsenic) and rare gas elements (e.g., one or more of helium, argon, and xenon) can be used.

As one of the methods for forming a region serving as a source region or a drain region by a self-aligned process in a transistor which includes an oxide semiconductor layer serving as a channel formation layer, a method has been disclosed in which a surface of an oxide semiconductor layer is exposed, argon plasma treatment is performed, and the resistivity of a region of the oxide semiconductor layer that is exposed to the plasma is reduced (S. Jeon et al., "180 nm Gate Length Amorphous InGaZnO Thin Film Transistor for High Density Image Sensor Applications", *IEDM Tech. Dig.*, 2010, pp. 504-507).

However, in the above manufacturing method, for exposure of part of the oxide semiconductor layer which is to be the region serving as the source region or the drain region, an insulating layer serving as a gate insulating layer needs to be partly removed after being formed. Therefore, at the time of removal of the insulating layer serving as the gate insulating layer, the oxide semiconductor layer of a lower layer is also partly over-etched and the thickness of the part which is to be the region serving as the source region or the drain region is reduced. As a result, resistance of the part which is to be the region serving as the source region or the drain region is increased, and poor characteristics of a transistor due to overetching easily occur.

For miniaturization of the transistor, a dry etching method, which has high processing accuracy, needs to be employed. However, the above overetching tends to easily occur in the case of employing a dry etching method, in which selectivity of the insulating layer serving as the gate insulating layer to the oxide semiconductor layer cannot be sufficiently secured.

For example, when the oxide semiconductor layer has a sufficient thickness, overetching does not cause a problem; however, when a channel length is 200 nm or less, the thickness of part of the oxide semiconductor layer which is to be the channel formation region needs to be 20 nm or less, preferably 10 nm or less so that a short channel effect is prevented. In the case where such a thin oxide semiconductor layer is handled, overetching of the oxide semiconductor layer is unfavorable because such overetching causes an increase in resistance of the region serving as the source region or the drain region and poor characteristics of the transistor which are described above.

On the other hand, when the dopant is added to the oxide semiconductor layer while the oxide semiconductor layer is not exposed and the insulating layer as the gate insulating layer is not removed, as in one embodiment of the present invention, overetching of the oxide semiconductor layer can be prevented and excessive damage to the oxide semiconductor layer can be reduced. In addition, an interface between the oxide semiconductor layer and the insulating layer serving as the gate insulating layer is also kept clean. Thus, the characteristics and reliability of the transistor can be improved.

Note that heat treatment may be performed after the dopant is added to the semiconductor layer 603_A.

The above is description of an example of a method for manufacturing the transistor illustrated in FIG. 4A.

Note that although the example of the method for manufacturing the transistor illustrated in FIG. 4A is described, this embodiment is not limited to this example. For example, as for the components in FIGS. 4B to 4D that have the same designations as the components in FIG. 4A and whose functions are at least partly the same as those of the components in FIG. 4A, the description of the example of the method for manufacturing the transistor illustrated in FIG. 4A can be referred to as appropriate.

For example, in the case where the transistor illustrated in FIG. 4B is manufactured, after the step illustrated in FIG. 5D, a second insulating film is formed over the insulating layer 606_A and the conductive layer 607_A and is partly etched, so that the insulating layer 609a_A and the insulating layer 609b_A are formed; then, the dopant is added to the semiconductor layer 603_A, so that the dopant is added to part of the semiconductor layer 603_A through the insulating layer 609a_A and the insulating layer 609b_A, and the region 608a_A and the region 608b_A are formed. Note that the second insulating film may be formed by sequential formation of a plurality of insulating films.

As described above with reference to FIGS. 4A to 4D and FIGS. 5A to 5E, an example of the transistor in this embodiment includes a semiconductor layer in which a channel is formed, a conductive layer which is electrically connected to the semiconductor layer and serves as one of a source and a drain, a conductive layer which is electrically connected to the semiconductor layer and serves as the other of the source and the drain, an insulating layer serving as a gate insulating layer, and a conductive layer which overlaps with the semiconductor layer with the insulating layer interposed therebetween and serves as a gate.

Since the transistor in this embodiment has low off-state current, by employing the transistor as a transistor serving as a selection transistor in the memory cell in the memory circuit or semiconductor memory device of the above semiconductor device, a data retention period can be lengthened. Accordingly, the number of times of refresh operations can be reduced, which leads to a reduction in power consumption.

Further, in this embodiment, the oxide semiconductor layer serving as a channel formation layer includes a region to which a dopant is added and which has lower resistance than the channel formation region and serves as the source region or the drain region, whereby resistance between the channel formation region and the source or drain of the transistor can be low even when the area of the transistor is small. Thus, a circuit area of a semiconductor device or a semiconductor memory device can be small.

Further, in this embodiment, a structure is employed in which the conductive layer serving as the gate and the conductive layer serving as the source or the drain do not overlap with each other, whereby parasitic capacitance between the gate and the source or the drain of the transistor can be reduced. Thus, a reduction in operating speed can be suppressed even when the area of the transistor is made small.

Further, in this embodiment, deterioration of the transistor due to light can be suppressed by employing a transistor including an oxide semiconductor layer in which at least a channel formation region is non-single-crystal and includes a phase which has a triangular, hexagonal, regular triangular, or regular hexagonal atomic arrangement when seen from the direction perpendicular to the a-b plane and in which metal atoms are arranged in a layered manner in the c-axis direction or the metal atoms and oxygen atoms are arranged in a layered manner in the c-axis direction.

Embodiment 4

Figure 6:
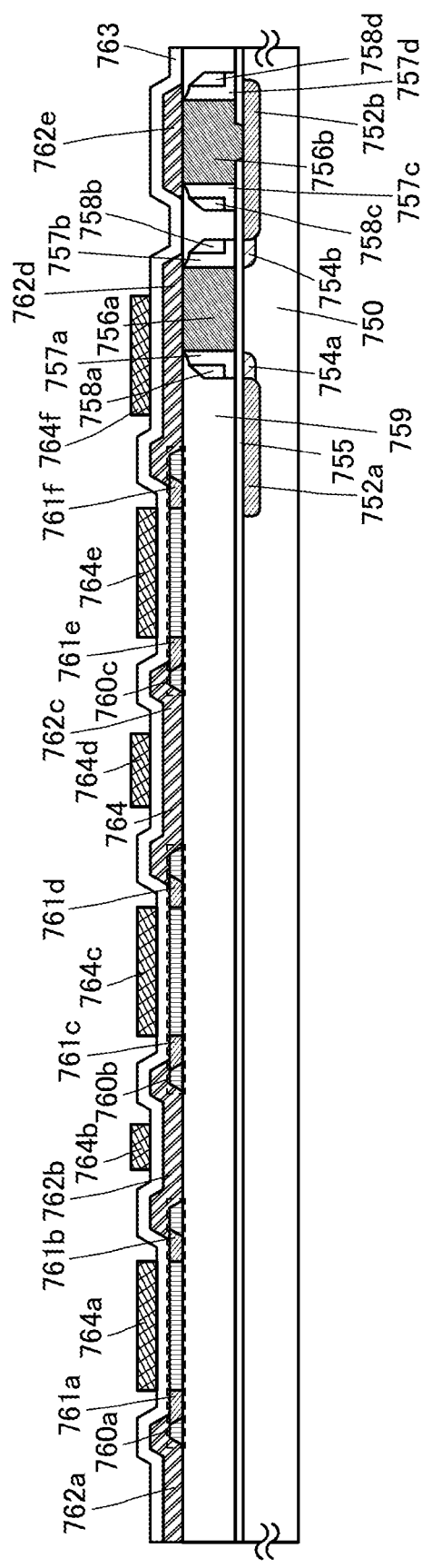
FIG. 6 is a cross-sectional schematic view illustrating an example of a structure of a memory cell in Embodiment 4.

In this embodiment, an example of a structure of a memory cell in the semiconductor memory device in Embodiment 2 is described with reference to FIG. 6. FIG. 6 is a cross-sectional schematic view illustrating an example of a structure of the memory cell in this embodiment. An example of a structure of a memory cell in the case where the number of transistors that serve as selection transistors and the number of transistors that serve as storage capacitors are each three (n=3) is described here. Note that the components illustrated in FIG. 6 include those having sizes different from the actual sizes.

The memory cell illustrated in FIG. 6 includes a semiconductor layer 750, an insulating layer 755, conductive layers 756a and 756b, insulating layers 757a, 757b, 757c, and 757d, insulating layers 758a, 758b, 758c, and 758d, an insulating layer 759, semiconductor layers 760a, 760b, and 760c, conductive layers 762a, 762b, 762c, 762d, and 762e, an insulating layer 763, and conductive layers 764a, 764b, 764c, 764d, 764e, and 764f.

The semiconductor layer 750 includes regions 752a, 752b, 754a, and 754b.

As the semiconductor layer 750, for example, a semiconductor substrate can be used. Alternatively, a semiconductor layer provided over a different substrate can be used as the semiconductor layer 750.

Note that in a region of the semiconductor layer 750 which is between a plurality of memory cells, an insulating separation region may be provided.

The region 752a and the region 752b are regions which are separated from each other and to which a dopant imparting n-type or p-type conductivity is added. The region 752a and the region 752b serve as a source region and a drain region of a transistor that serves as an output transistor in the memory cell.

The region 754a and the region 754b are provided between the region 752a and the region 752b so as to be separated from each other, and a region between the region 754a and the region 754b serves as a channel formation region. The region 754a is in contact with the region 752a, and the region 754b is in contact with the region 752b.

As in the region 752a and the region 752b, the region 754a and the region 754b are regions to which a dopant imparting n-type or p-type conductivity is added.

Note that the concentration of the dopant of the region 754a and the region 754b may be lower than the concentration of the dopant of the region 752a and the region 752b. In that case, the region 754a and the region 754b are also referred to as low concentration regions. Further, in that case, the region 752a and the region 752b may be referred to as high concentration regions. The region 754a and the region 754b may have a shallower depth than the region 752a and the region 752b; however, the present invention is not limited thereto.

The insulating layer 755 is provided over the semiconductor layer 750. The insulating layer 755 serves as a gate insulating layer of the transistor that serves as the output transistor in the memory cell.

As the insulating layer 755, for example, a layer of a material such as silicon oxide, silicon nitride, silicon oxynitride, silicon nitride oxide, aluminum oxide, aluminum nitride, aluminum oxynitride, aluminum nitride oxide, hafnium oxide, or an organic insulating material (e.g., polyimide or acrylic) can be used. The insulating layer 755 may be formed by stacking layers formed using materials that can be used for the insulating layer 755.

The conductive layer 756a overlaps with the semiconductor layer 750 with the insulating layer 755 interposed therebetween. A region of the semiconductor layer 750, which overlaps with the conductive layer 756a serves as the channel formation region of the output transistor in the memory cell. The conductive layer 756a serves as a gate of the transistor that serves as the output transistor in the memory cell.

The conductive layer 756b is provided over the insulating layer 755 and is electrically connected to the region 752b through an opening portion penetrating the insulating layer 755.

The insulating layer 757a is provided over the insulating layer 755 and is in contact with one of a pair of side surfaces of the conductive layer 756a which face each other.

The insulating layer 757b is provided over the insulating layer 755 and is in contact with the other of the pair of side surfaces of the conductive layer 756a which face each other.

The insulating layer 757c is provided over the insulating layer 755 and is in contact with one of a pair of side surfaces of the conductive layer 756b which face each other.

The insulating layer 757d is provided over the insulating layer 755 and is in contact with the other of the pair of side surfaces of the conductive layer 756b which face each other.

The insulating layer 758a is provided over the insulating layer 757a.

The insulating layer 758b is provided over the insulating layer 757b.

The insulating layer 758c is provided over the insulating layer 757c.

The insulating layer 758d is provided over the insulating layer 757d.

The insulating layer 759 is provided over the insulating layer 755.

The semiconductor layer 760a is provided over the insulating layer 759. The semiconductor layer 760a includes a region 761a and a region 761b.

The semiconductor layer 760b is provided over the insulating layer 759. The semiconductor layer 760b includes a region 761c and a region 761d.

The semiconductor layer 760c is provided over the insulating layer 759. The semiconductor layer 760c includes a region 761e and a region 761f.

As the semiconductor layers 760a to 760c, for example, a layer formed using a material that can be used for the semiconductor layer 603_A of the transistor described in Embodiment 3 with reference to FIG. 4A can be used. The semiconductor layers 760a to 760c serve as channel formation layers of transistors that serve as selection transistors in the memory cell.

The regions 761a to 761f are regions to which a dopant imparting n-type conductivity is added. As the dopant to be added to the regions 761a to 761f, a dopant which can be used as the dopant added to the region 604a_A and the region 604b_A of the transistor that is described in Embodiment 3 with reference to FIG. 4A can be used. The concentration of the dopant of the regions 761a to 761f can be set within the range of the concentration of the dopant which can be employed for the region 604a_A and the region 604b_A.

The region 761a and the region 761b are provided so as to be separated from each other. A channel is formed between the region 761a and the region 761b.

The region 761c and the region 761d are provided so as to be separated from each other. A channel is formed between the region 761c and the region 761d.

The region 761e and the region 761f are provided so as to be separated from each other. A channel is formed between the region 761e and the region 761f.

The conductive layer 762a is electrically connected to the semiconductor layer 760a. Further, part of the conductive layer 762a overlaps with the region 761a. The conductive layer 762a serves as a source or a drain of the transistor that serves as the selection transistor in the memory cell.

The conductive layer 762b is electrically connected to the semiconductor layers 760a and 760b. Further, part of the conductive layer 762b overlaps with the regions 761b and 761c. The conductive layer 762b serves as the source or the drain of the transistor that serves as the selection transistor in the memory cell and also serves as one of a pair of electrodes of a capacitor that serves as a storage capacitor in the memory cell.

The conductive layer 762c is electrically connected to the semiconductor layers 760b and 760c. Further, part of the conductive layer 762c overlaps with the regions 761d and 761e. The conductive layer 762c serves as a source or a drain of the transistor that serves as the selection transistor in the memory cell and also serves as one of a pair of electrodes of a capacitor that serves as a storage capacitor in the memory cell.

The conductive layer 762d is electrically connected to the conductive layer 756a and the semiconductor layer 760c. In this embodiment, as illustrated in FIG. 6, the conductive layer 762d is in contact with the conductive layer 756a, whereby contact resistance between the conductive layer 762d and the conductive layer 756a can be low. Further, part of the conductive layer 762d overlaps with the region 761f. The conductive layer 762d serves as the source or the drain of the transistor that serves as the selection transistor in the memory cell and also serves as one of a pair of electrodes of a capacitor that serves as a storage capacitor in the memory cell.

The conductive layer 762e is electrically connected to the conductive layer 756b. In this embodiment, as illustrated in FIG. 6, the conductive layer 762e is in contact with the conductive layer 756b, whereby contact resistance between the conductive layer 762e and the conductive layer 756b can be low. The conductive layer 762d serves as a reading selection line.

As the conductive layers 762a to 762e, for example, a layer formed using a material that can be used for the conductive layer 605a_A and the conductive layer 605b_A of the transistor described in Embodiment 3 with reference to FIG. 4A can be used.

The insulating layer 763 is provided over the semiconductor layers 760a to 760c. The insulating layer 763 serves as a gate insulating layer of the transistor that serves as the selection transistor in the memory cell and also serves as a dielectric layer of the capacitor that serves as the storage capacitor in the memory cell.

As the insulating layer 763, for example, a layer formed using a material that can be used for the insulating layer 606_A of the transistor described in Embodiment 3 with reference to FIG. 4A can be used.

The conductive layer 764a overlaps with the semiconductor layer 760a with the insulating layer 763 interposed therebetween. The conductive layer 764a serves as a gate of the transistor that serves as the selection transistor in the memory cell.

The conductive layer 764b overlaps with the conductive layer 762b with the insulating layer 763 interposed therebetween. The conductive layer 764b serves as the other of the pair of electrodes of the capacitor that serves as the storage capacitor in the memory cell.

The conductive layer 764c overlaps with the semiconductor layer 760b with the insulating layer 763 interposed therebetween. The conductive layer 764c serves as a gate of the transistor that serves as the selection transistor in the memory cell.

The conductive layer 764d overlaps with the conductive layer 762c with the insulating layer 763 interposed therebetween. The conductive layer 764d serves as the other of the pair of electrodes of the capacitor that serves as the storage capacitor in the memory cell.

The conductive layer 764e overlaps with the semiconductor layer 760c with the insulating layer 763 interposed therebetween. The conductive layer 764e serves as a gate of the transistor that serves as the selection transistor in the memory cell.

The conductive layer 764f overlaps with the conductive layer 762d with the insulating layer 763 interposed therebetween. The conductive layer 764f serves as the other of the pair of electrodes of the capacitor that serves as the storage capacitor in the memory cell.

Note that the area of the conductive layer 764f is larger than that of the conductive layer 764d and the area of the conductive layer 764d is larger than that of the conductive layer 764b. Thus, the capacitors can have different capacitance values. However, the present invention is not limited thereto.

As the conductive layers 764a to 764f, for example, a layer formed using a material that can be used for the conductive layer 607_A of the transistor described in Embodiment 3 with reference to FIG. 4A can be used.

The above is description of an example of a structure of the memory cell illustrated in FIG. 6.

In this embodiment, the area of a memory cell can be made small by employing a stack of a plurality of transistors. Further, although a structure is illustrated in FIG. 6 in which a plurality of transistors formed using different materials are stacked, the present invention is not limited to the structure and a structure may be employed in which a plurality of transistors formed using the same material (transistors including oxide semiconductor layers) are stacked. In that case, the area of a memory cell can be further reduced.

In addition, in this embodiment, a transistor serving as an output transistor in the memory cell includes a semiconductor layer which contains a semiconductor belonging to Group 14 (e.g., silicon) and has high current supply capability, and a transistor serving as a selection transistor in the memory cell includes an oxide semiconductor layer and has low off-state current; accordingly, leakage current due to a transistor can be low and a data retention period can be lengthened.

Furthermore, in this embodiment, the oxide semiconductor layer which is included in the transistor serving as the selection transistor includes a region to which a dopant is added, whereby resistance between a channel formation region and a source or a drain can be low even when the area of the memory cell is small. Thus, the area of a semiconductor device or a semiconductor memory device can be small.

Embodiment 5

In this embodiment, an example of a structure of a semiconductor memory device is described.

Figure 7:
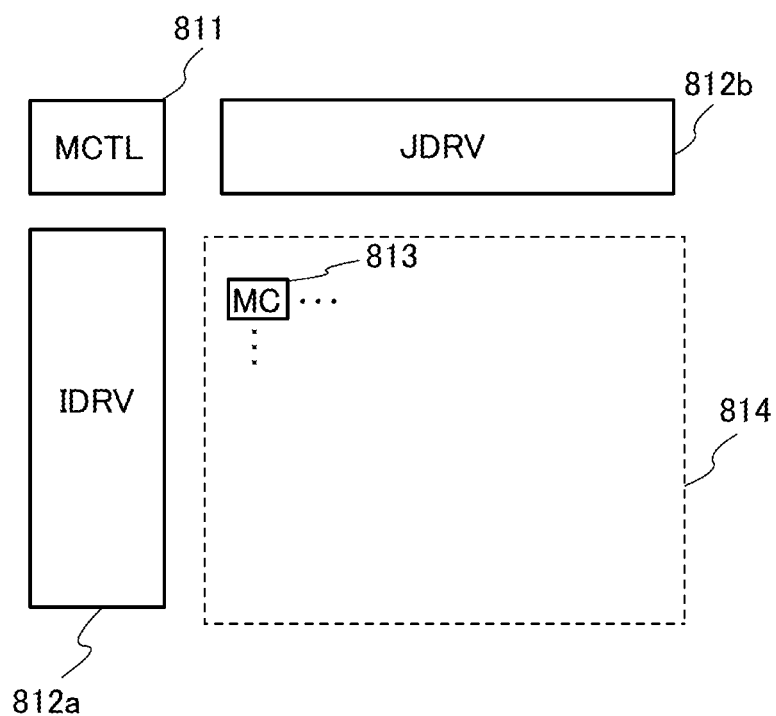
FIG. 7 is a block diagram illustrating an example of a structure of a semiconductor memory device in Embodiment 5.

First, an example of a structure of a semiconductor memory device in this embodiment is described with reference to FIG. 7. FIG. 7 is a block diagram illustrating an example of a structure of the semiconductor memory device in this embodiment.

The semiconductor memory device illustrated in FIG. 7 includes a drive control circuit (also referred to as MCTL) 811, a driver circuit 812a (also referred to as IDRV), a driver circuit 812b (also referred to as JDRV), and a plurality of memory cells (also referred to as MC) 813.

A write control signal, a read control signal, and an address signal are input to the drive control circuit 811. The drive control circuit 811 generates and outputs a plurality of control signals in accordance with the input write control signal, read control signal, and address signal. For example, the drive control circuit 811 outputs a row address signal and a column address signal in accordance with the address signal input.

A row address signal is input to the driver circuit 812a. The driver circuit 812a selects a wiring (including, for example, a word line) arranged in a row direction in accordance with the row address signal input and sets the voltage of the wiring. The driver circuit 812a is provided with a first decoder, for example. The first decoder selects a wiring arranged in a row direction in accordance with the row address signal input.

A data signal and a column address signal are input to the driver circuit 812b. The driver circuit 812b sets the voltage of a wiring (including, for example, a data line) arranged in a column direction. The driver circuit 812b is provided with a second decoder and a plurality of analog switches, for example. The second decoder selects a wiring arranged in a column direction and the plurality of analog switches determine whether or not the data signal is output in accordance with a signal input from the second decoder. Note that the driver circuit 812b may be provided with a reading signal output circuit and a read circuit. The reading signal output circuit outputs a reading signal to a wiring serving as a reading selection line, and the read circuit reads data stored in the memory cell 813 electrically connected to a wiring that is selected with a reading signal.

The memory cell 813 is provided in a memory cell array 814. The memory cell described in the above embodiment can be used as the memory cell 813. The memory cell 813 is selected by the driver circuit 812a and the driver circuit 812b, and data writing or data reading is performed in the selected memory cell 813.

In the semiconductor memory device illustrated in FIG. 7, the memory cell is selected by the driver circuits in accordance with a signal input to the drive control circuit, and a write operation or a read operation is performed.

Figure 8A:
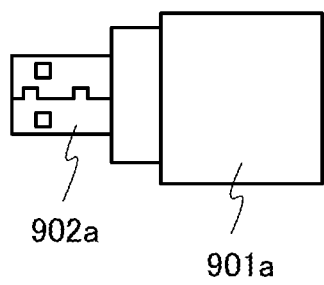
FIGS. 8A and 8B are schematic views each illustrating an example of a structure of a semiconductor memory device in Embodiment 5.
Figure 8B:
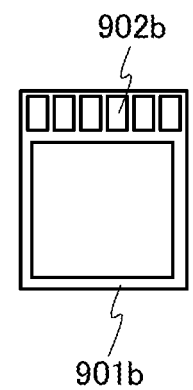

Further, an example of a semiconductor memory device in this embodiment is described with reference to FIGS. 8A and 8B. FIGS. 8A and 8B are schematic views each illustrating an example of a structure of the semiconductor memory device in this embodiment.

The semiconductor memory device illustrated in FIG. 8A is also referred to as a universal serial bus (USB) memory. The semiconductor memory device illustrated in FIG. 8A includes a housing 901a and a connector portion 902a.

The housing 901a includes, for example, the memory cell array, the driver circuit, and the drive control circuit which are illustrated in FIG. 7.

The connector portion 902a is electrically connected to the drive control circuit. The connector portion 902a is a terminal portion capable of being connected to a USB port of another electronic device.

When the semiconductor memory device illustrated in FIG. 8A and another electronic device are electrically connected by inserting the connector portion 902a into a USB port of the electronic device, data from the electronic device can be written to the semiconductor memory device or data can be read out of the semiconductor memory device to the electronic device.

The semiconductor memory device illustrated in FIG. 8B is a card-type semiconductor memory device. The semiconductor memory device illustrated in FIG. 8B includes a housing 901b and a connector portion 902b.

The housing 901b includes, for example, the memory cell array, the driver circuit, and the drive control circuit which are illustrated in FIG. 7.

The connector portion 902b is electrically connected to the drive control circuit. The connector portion 902b is a terminal portion capable of being connected to a card slot portion of another electronic device.

When the semiconductor memory device illustrated in FIG. 8B and another electronic device are electrically connected by inserting the connector portion 902b into a card slot portion of the electronic device, data from the electronic device can be written to the semiconductor memory device or data can be read out of the semiconductor memory device to the electronic device.

When the structure of the memory cell array described in Embodiment 2 is employed as a structure of the memory cell array of the semiconductor memory device described with reference to FIG. 8A or FIG. 8B, a semiconductor memory device in which noise less influences on a data signal can be formed.

Embodiment 6

In this embodiment, examples of electronic devices each including the semiconductor memory device in the above embodiment are described.

Examples of structures of electronic devices in this embodiment are described with reference to FIGS. 9A to 9D.

Figure 9A:
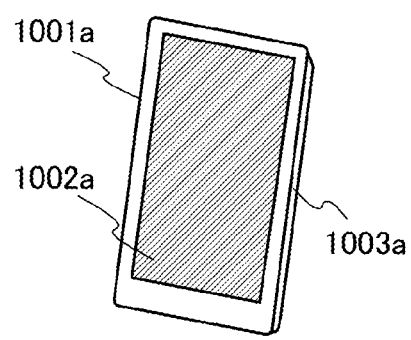
FIGS. 9A to 9D are schematic views each illustrating an example of an electronic device in Embodiment 6.

The electronic device illustrated in FIG. 9A is an example of a personal digital assistant. The personal digital assistant illustrated in FIG. 9A includes a housing 1001a and a display portion 1002a provided in the housing 1001a.

Note that a side surface 1003a of the housing 1001a may be provided with a connection terminal for connecting the personal digital assistant to an external device and/or a button for operating the personal digital assistant illustrated in FIG. 9A.

The personal digital assistant illustrated in FIG. 9A includes a CPU, a memory circuit, an interface for transmitting and receiving a signal between the external device and each of the CPU and the memory circuit, and an antenna for transmitting and receiving a signal to and from the external device, in the housing 1001a.

The personal digital assistant illustrated in FIG. 9A serves as one or more of a telephone set, an e-book reader, a personal computer, and a game machine, for example.

Figure 9C:
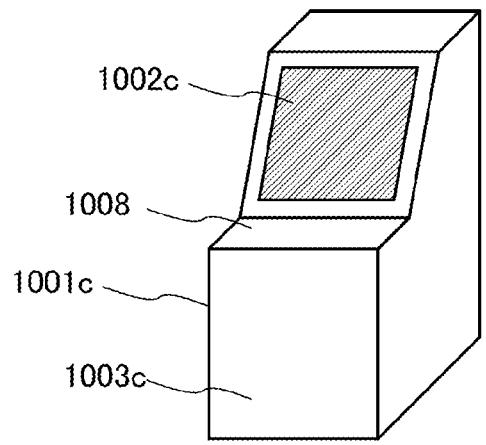
Figure 9B:
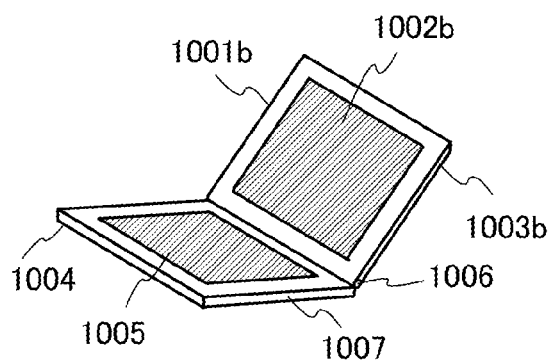

The electronic device illustrated in FIG. 9B is an example of a folding personal digital assistant. The personal digital assistant illustrated in FIG. 9B includes a housing 1001*b*, a display portion 1002*b* provided in the housing 1001*b*, a housing 1004, a display portion 1005 provided in the housing 1004, and a hinge 1006 for connecting the housing 1001*b* and the housing 1004.

In the personal digital assistant illustrated in FIG. 9B, the housing 1001*b* can be stacked on the housing 1004 by moving the housing 1001*b* or the housing 1004 with the hinge 1006.

Note that a side surface 1003*b* of the housing 1001*b* or a side surface 1007 of the housing 1004 may be provided with a connection terminal for connecting the personal digital assistant to an external device and/or a button for operating the personal digital assistant illustrated in FIG. 9B.

The display portion 1002*b* and the display portion 1005 may display different images or one image. Note that the display portion 1005 is not necessarily provided, and a keyboard which is an input device may be provided instead of the display portion 1005.

The personal digital assistant illustrated in FIG. 9B includes a CPU, a memory circuit, and an interface for transmitting and receiving a signal between the external device and each of the CPU and the memory circuit in the housing 1001*b* or the housing 1004. Note that the personal digital assistant illustrated in FIG. 9B may include an antenna for transmitting and receiving a signal to and from the external device.

The personal digital assistant illustrated in FIG. 9B serves as one or more of a telephone set, an e-book reader, a personal computer, and a game machine, for example.

The electronic device illustrated in FIG. 9C is an example of a stationary information terminal. The stationary information terminal illustrated in FIG. 9C includes a housing 1001*c* and a display portion 1002*c* provided in the housing 1001*c*.

Note that the display portion 1002*c* can be provided on a deck portion 1008 in the housing 1001*c*.

The stationary information terminal illustrated in FIG. 9C includes a CPU, a memory circuit, and an interface for transmitting and receiving a signal between the external device and each of the CPU and the memory circuit in the housing 1001*c*. Note that the stationary information terminal illustrated in FIG. 9C may include an antenna for transmitting and receiving a signal to and from the external device.

Further, a side surface 1003*c* of the housing 1001*c* in the stationary information terminal illustrated in FIG. 9C may be provided with one or more of a ticket output portion that outputs a ticket or the like, a coin slot, and a bill slot.

The stationary information terminal illustrated in FIG. 9C serves as an automated teller machine, an information communication terminal (also referred to as a multimedia station) for ordering a ticket or the like, or a game machine, for example.

Figure 9D:
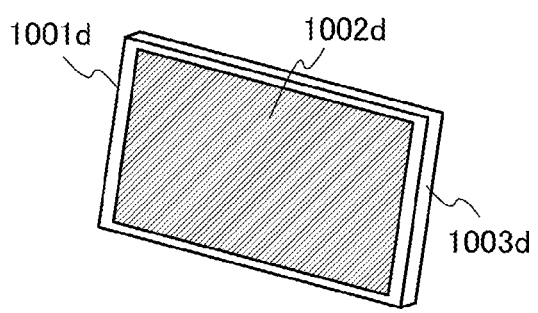

The electronic device illustrated in FIG. 9D is an example of a stationary information terminal. The stationary information terminal illustrated in FIG. 9D includes a housing 1001*d* and a display portion 1002*d* provided in the housing 1001*d*. Note that a support for supporting the housing 1001*d* may also be provided.

Note that a side surface 1003*d* of the housing 1001*d* may be provided with a connection terminal for connecting the stationary information terminal to an external device and/or a button for operating the stationary information terminal illustrated in FIG. 9D.

The stationary information terminal illustrated in FIG. 9D may include a CPU, a memory circuit, and an interface for transmitting and receiving a signal between the external device and each of the CPU and the memory circuit in the housing 1001*d*. Note that the stationary information terminal illustrated in FIG. 9D may include an antenna for transmitting and receiving a signal to and from the external device.

The stationary information terminal illustrated in FIG. 9D serves as a digital photo frame, a monitor, or a television set, for example.

The semiconductor memory device in the above embodiment is used as one memory device in an electronic device, for example. For example, the semiconductor memory device in the above embodiment is used as one of the memory devices in the electronic devices illustrated in FIGS. 9A to 9D. Note that the present invention is not limited thereto; it is possible to provide any of the electronic devices illustrated in FIGS. 9A to 9D with a memory device connection portion and to connect any of the memory devices illustrated in FIGS. 8A and 8B to the memory device connection portion, so that data can be written to or read from the memory device.

As described with reference to FIGS. 9A to 9D, the examples of the electronic devices in this embodiment each include a memory device which includes the semiconductor memory device in the above embodiment.

With such a structure, even when power is not supplied, data in an electronic device can be retained for a certain period. Thus, reliability can be improved and power consumption can be reduced.

A specific example is described below in which the semiconductor memory device in the above embodiment is applied to a portable device such as a personal digital assistant, a mobile phone, a smartphone, or an e-book reader.

Figure 10:
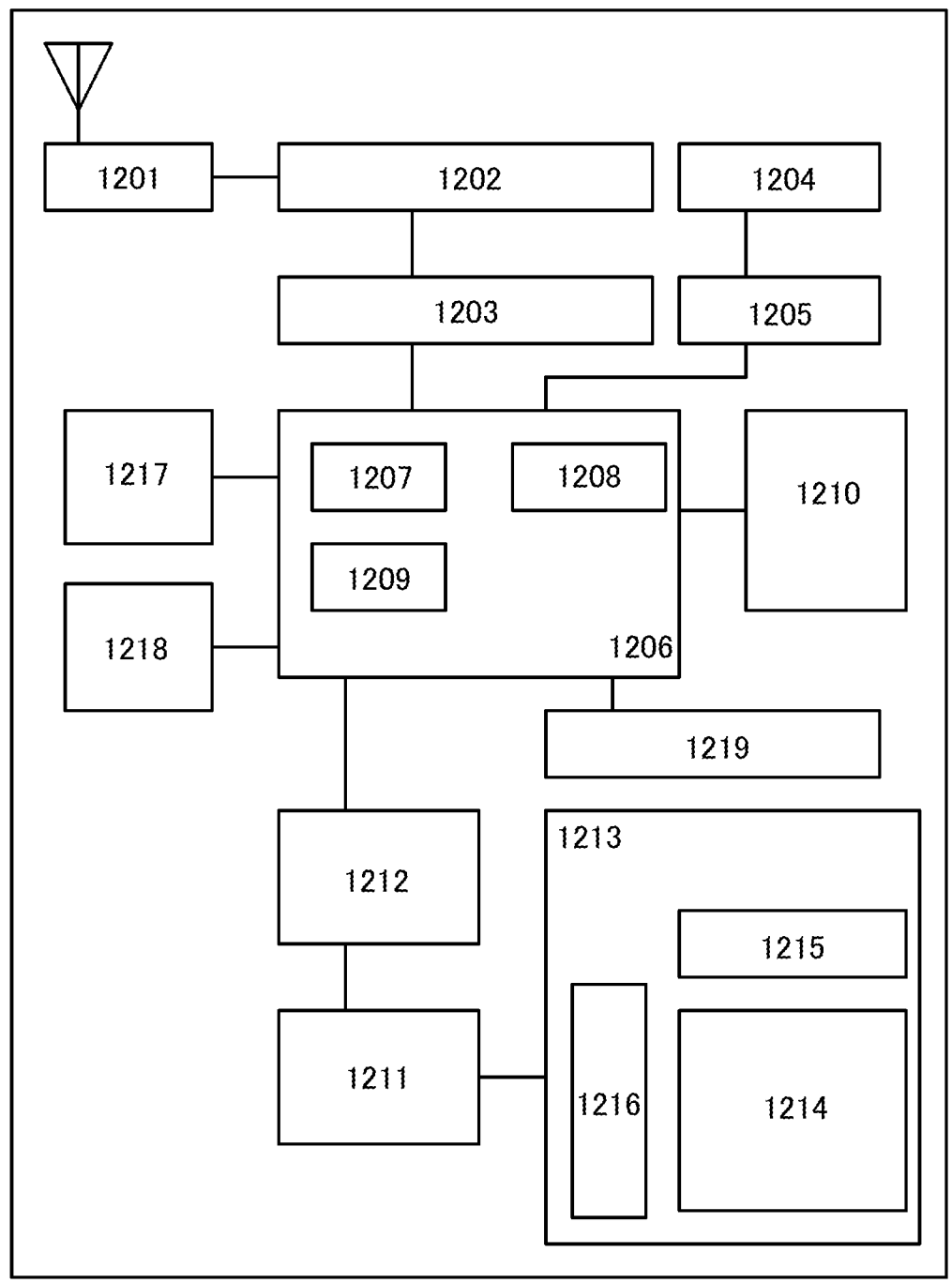
FIG. 10 is a block diagram illustrating an example of a structure of a mobile phone.

FIG. 10 is a block diagram illustrating an example of a portable device. The portable device illustrated in FIG. 10 includes an antenna circuit 1201, an analog baseband circuit 1202, a digital baseband circuit 1203, a battery 1204, a power supply circuit 1205, an application processor 1206, a memory 1210 that is a flash memory, a display controller 1211, a memory 1212, a display 1213, a touch sensor 1219, an audio circuit 1217 (such as a speaker or a microphone), and a keyboard 1218 that is an input means.

The antenna circuit 1201 receives an electric wave including data, for example.

The display 1213 includes the display portion 1214, a source driver 1215, and a gate driver 1216. Operation of the display portion 1214 is controlled by the source driver 1215 and the gate driver 1216.

The application processor 1206 includes a CPU 1207, a digital signal processor (also referred to as a DSP) 1208, and an interface (also referred to as an IF) 1209.

As the memory 1212, the semiconductor memory device in the above embodiment can be used.

By providing the touch sensor 1219, a display portion 1214 of the display 1213 can be operated.

Figure 11:
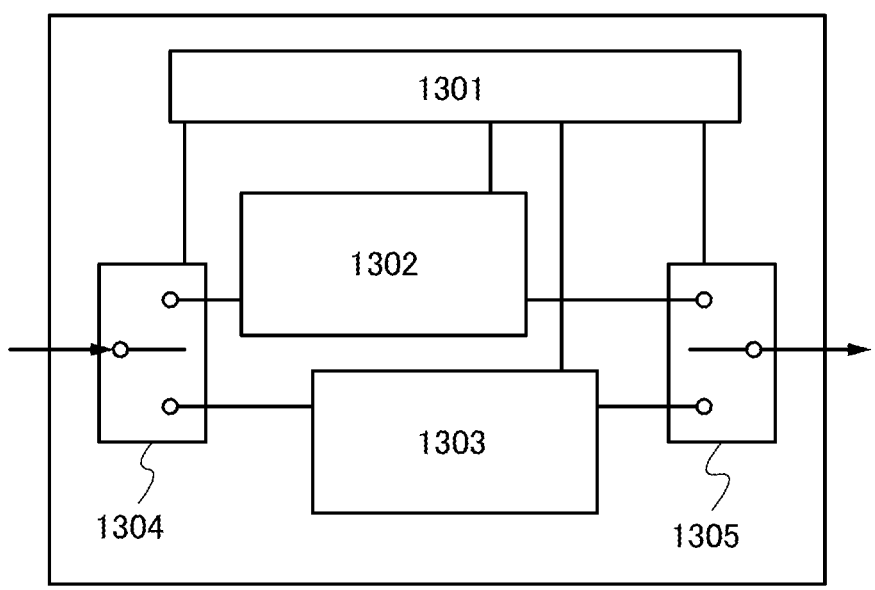
FIG. 11 is a block diagram illustrating an example of a structure of a memory.

Further, an example of a structure of the memory 1212 to which the semiconductor memory device in the above embodiment is applied is illustrated in FIG. 11.

A memory illustrated in FIG. 11 includes a memory device 1302 and a memory device 1303 to which the semiconductor memory device in the above embodiment is applied, a switch 1304, a switch 1305, and a memory controller 1301.

Further, an example of operation of the portable device illustrated in FIG. 10 is described. Note that here the case where the memory 1212 has the structure illustrated in FIG. 11 is described.

First, an image is formed as a result of reception of an electric wave including data, or by the application processor 1206. The formed image is stored in the memory device 1302 as data through the switch 1304. Then, the data stored in the memory device 1302 is output to the display controller 1211 through the switch 1305 and then to the display 1213; an image based on the input image data is displayed by the display 1213. In the case where the image is not changed, the data is read from the memory device 1302 at a frequency of, usually, higher than or equal to 60 Hz and lower than or equal to 130 Hz, and the read data is continuously sent to the display controller 1211 through the switch 1305. In the case where the user carries out an operation to rewrite the image, a new image is formed by the application processor 1206, and the image is stored in the memory device 1303 as data through the switch 1304. Also during this step, the image data is regularly read from the memory device 1302 through the switch 1305. After the new image data is stored in the memory device 1303, in a subsequent frame period of the display 1213, the data stored in the memory device 1303 is read and the read data is output to the display 1213 through the switch 1305 and the display controller 1211. The display 1213 to which the data is input displays an image based on the input image data. The above-described read operation is repeated until when next data is stored in the memory device 1302. Data is written to and read from the memory device 1302 and the memory device 1303 alternately in this manner, whereby the display 1213 displays an image.

Note that the memory device 1302 and the memory device 1303 are not limited to different memory chips; one memory chip may be shared and used as the memory device 1302 and the memory device 1303.

As described above, when the semiconductor memory device in the above embodiment is used for the memory device 1302 and the memory device 1303, a unit price of a memory can be reduced and power consumption can also be reduced.

Figure 12:
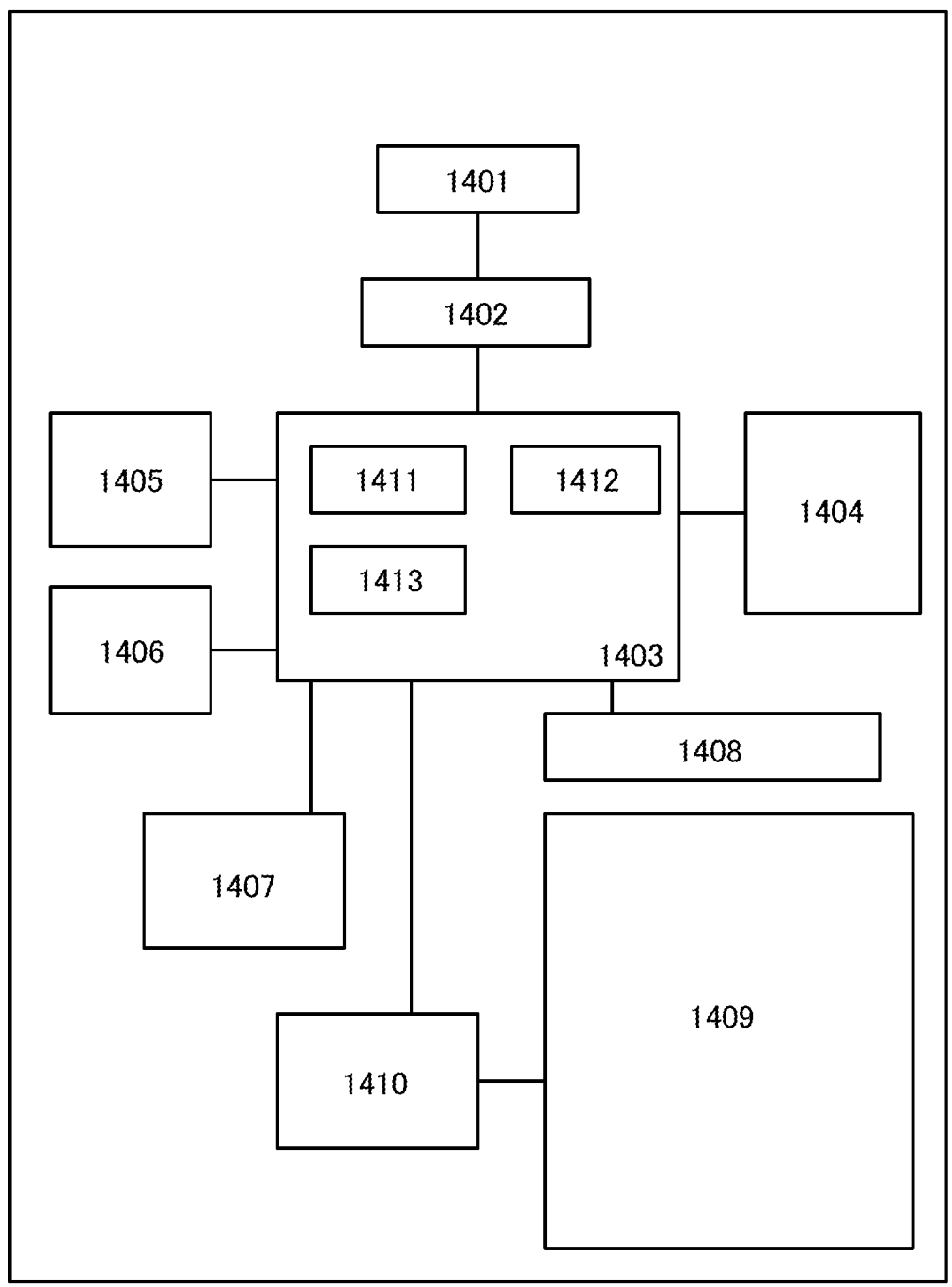
FIG. 12 is a block diagram illustrating an example of a structure of an e-book reader.

FIG. 12 is a block diagram illustrating an example of an e-book reader. In FIG. 12, for example, a battery 1401, a power supply circuit 1402, a microprocessor 1403, a memory 1404 that is a flash memory, an audio circuit 1405, a keyboard 1406, a memory 1407, a touch panel 1408, a display 1409, and a display controller 1410 are included.

The microprocessor 1403 includes, for example, a CPU 1411, a DSP 1412, and an IF 1413.

For example, the semiconductor memory device in the above embodiment can be used for the memory 1407. The memory 1407 temporarily retains the contents of books as data.

A function of the memory 1407 can be applied to, for example, the case where the user utilizes a highlighting function. For example, when the user reads an e-book, the user will put a mark on a specific part in some cases. Such a marking function is called a highlighting function, by which characters are changed in color or type, underlined, or bold-faced, for example, so that a specific part is made to look distinct from the other part. In the function, information about the part specified by the user is stored and retained. In the case where the information is stored for a long time, the information may be copied to the memory 1404.

As described above, the semiconductor memory device in the above embodiment can be used for an electronic device.

This application is based on Japanese Patent Application serial no. 2011-004818 filed with Japan Patent Office on Jan. 13, 2011, the entire contents of which are hereby incorporated by reference.

What is claimed is:

1. A semiconductor device comprising:
   a memory circuit,
   wherein the memory circuit comprises:
      n field-effect transistors (n is a natural number of 2 or more) in a first group;
      n capacitors each including a pair of electrodes; and
      a field-effect transistor in a second group,
   wherein a digital data signal is input to one of source and drain of a first field-effect transistor of the n field-effect transistors in the first group,
   wherein one of source and drain of a second field-effect transistor of the n field-effect transistors in the first group is electrically connected to the other of source and drain of the first field-effect transistor of the n field-effect transistors in the first group,
   wherein one of the pair of electrodes of a first capacitor of the n capacitors is electrically connected to the other of source and drain of the first field-effect transistor of the n field-effect transistors in the first group and the other of the pair of electrodes of the first capacitor of the n capacitors is electrically connected to a wiring,
   wherein one of the pair of electrodes of a second capacitor of the n capacitors is electrically connected to the other of source and drain of the second field-effect transistor of the n field-effect transistors in the first group and the other of the pair of electrodes of the second capacitor of the n capacitors is electrically connected to the wiring, and
   wherein a gate of the field-effect transistor in the second group is electrically connected to the other of source and drain of an n-th field-effect transistor in the first group.

2. The semiconductor device according to claim 1, wherein the n field-effect transistors each include an oxide semiconductor layer in which a channel is formed.

3. The semiconductor device according to claim 2, wherein the oxide semiconductor layer includes a pair of regions which are separated from each other, to which a dopant is added, and between which the channel is formed.

4. The semiconductor device according to claim 2, wherein at least a region of the oxide semiconductor layer, in which the channel is formed is non-single-crystal and includes a phase which has a triangular, hexagonal, regular triangular, or regular hexagonal atomic arrangement when seen from a direction perpendicular to an a-b plane and in which metal atoms are arranged in a layered manner in a c-axis direction or the metal atoms and oxygen atoms are arranged in a layered manner in the c-axis direction.

5. A semiconductor device comprising:
   a memory circuit,
   wherein the memory circuit comprises:
      n field-effect transistors (n is a natural number of 2 or more) in a first group;
      n capacitors each including a pair of electrodes; and
      a field-effect transistor in a second group,
   wherein a digital data signal is input to one of source and drain of a first field-effect transistor in the first group,
   wherein one of source and drain of a second field-effect transistor in the first group is electrically connected to the other of source and drain of the first field-effect transistor in the first group,
   wherein one of the pair of electrodes of a first of the n capacitors is electrically connected to the other of source and drain of the first field-effect transistor in the first group and the other of the pair of electrodes of the first capacitor of the n capacitors is electrically connected to a wiring,
   wherein one of the pair of electrodes of a second capacitor of the n capacitors is electrically connected to the other of source and drain of the second field-effect transistor of the n field-effect transistors in the first group and the other of the pair of electrodes of the second capacitor of the n capacitors is electrically connected to the wiring, wherein at least two of the n capacitors have different capacitance values, and wherein a gate of the field-effect transistor in the second group is electrically connected to the other of source and drain of an n-th field-effect transistor in the first group.

6. The semiconductor device according to claim 5, wherein the n field-effect transistors in the first group each include an oxide semiconductor layer in which a channel is formed.

7. The semiconductor device according to claim 6, wherein the oxide semiconductor layer includes a pair of regions which are separated from each other, to which a dopant is added, and between which the channel is formed.

8. The semiconductor device according to claim 6, wherein at least a region of the oxide semiconductor layer, in which the channel is formed is non-single-crystal and includes a phase which has a triangular, hexagonal, regular triangular, or regular hexagonal atomic arrangement when seen from a direction perpendicular to an a-b plane and in which metal atoms are arranged in a layered manner in a c-axis direction or the metal atoms and oxygen atoms are arranged in a layered manner in the c-axis direction.

9. A semiconductor memory device comprising:
a plurality of memory cells arranged in i rows (i is a natural number of 2 or more) and j columns (j is a natural number);
j first wirings;
(n×i) second wirings (n is a natural number of 2 or more);
i third wirings;
j fourth wirings; and
i fifth wirings,
wherein a memory cell in an M-th row (M is a natural number of i or less) and an N-th column (N is a natural number of j or less) of the plurality of memory cells comprises:
n field-effect transistors in a first group;
n capacitors each including a pair of electrodes; and
a field-effect transistor in a second group,
wherein one of source and drain of a first field-effect transistor in the first group is electrically connected to an N-th first wiring of the j first wirings,
wherein a gate of an m-th field-effect transistor (m is a natural number of n or less) in the first group is electrically connected to an (M×m)-th second wiring of the (n×i) second wirings,
wherein one of source and drain of a k-th field-effect transistor (k is a natural number of greater than or equal to 2 and less than or equal to n) in the first group is electrically connected to the other of source and drain of a (k−1)-th field-effect transistor in the first group,
wherein one of the pair of electrodes of an m-th capacitor of the n capacitors is electrically connected to the other of source and drain of the m-th field-effect transistor in the first group,
wherein the other of the pair of electrodes of the m-th capacitor is electrically connected to an M-th third wiring of the i third wirings,
wherein at least two of the n capacitors have different capacitance values,
wherein one of source and drain of the field-effect transistor in the second group is electrically connected to an N-th fourth wiring of the j fourth wirings,
wherein the other of the source and the drain of the field-effect transistor in the second group is electrically connected to an M-th fifth wiring of the i fifth wirings, and wherein a gate of the field-effect transistor in the second group is electrically connected to the other of source and drain of an n-th field-effect transistor in the first group.

10. The semiconductor memory device according to claim 9, wherein the n field-effect transistors in the first group each include an oxide semiconductor layer in which a channel is formed.

11. The semiconductor memory device according to claim 10, wherein the oxide semiconductor layer includes a pair of regions which are separated from each other, to which a dopant is added, and between which the channel is formed.

12. The semiconductor memory device according to claim 10, wherein at least a region of the oxide semiconductor layer, in which the channel is formed is non-single-crystal and includes a phase which has a triangular, hexagonal, regular triangular, or regular hexagonal atomic arrangement when seen from a direction perpendicular to an a-b plane and in which metal atoms are arranged in a layered manner in a c-axis direction or the metal atoms and oxygen atoms are arranged in a layered manner in the c-axis direction.

13. A semiconductor device comprising:
a memory circuit,
wherein the memory circuit comprises:
first to third transistors; and
first and second capacitors,
wherein a digital data signal is input to one of source and drain of the first transistor,
wherein one of source and drain of the second transistor is electrically connected to the other of source and drain of the first transistor,
wherein one electrode of the first capacitor is electrically connected to the other of source and drain of the first transistor and the other electrode of the first capacitor is electrically connected to a wiring,
wherein one electrode of the second capacitor is electrically connected to the other of source and drain of the second transistor and the other electrode of the second capacitor is electrically connected to the wiring, and
wherein a gate of the third transistor is electrically connected to the other of source and drain of the second transistor.

14. The semiconductor device according to claim 13, wherein the first and second transistors each include an oxide semiconductor layer in which a channel is formed.

15. The semiconductor device according to claim 14, wherein the oxide semiconductor layer includes a pair of regions which are separated from each other, to which a dopant is added, and between which the channel is formed.

16. The semiconductor device according to claim 14, wherein at least a region of the oxide semiconductor layer, in which the channel is formed is non-single-crystal and includes a phase which has a triangular, hexagonal, regular triangular, or regular hexagonal atomic arrangement when seen from a direction perpendicular to an a-b plane and in which metal atoms are arranged in a layered manner in a c-axis direction or the metal atoms and oxygen atoms are arranged in a layered manner in the c-axis direction.

17. The semiconductor device according to claim 13, wherein the first and second capacitors have different capacitance values.

* * * * *